US012002789B2

(12) United States Patent
Harrold et al.

(10) Patent No.: US 12,002,789 B2
(45) Date of Patent: Jun. 4, 2024

(54) DISPLAY APPARATUS

(71) Applicant: Optovate Limited, Oxfordshire (GB)

(72) Inventors: Jonathan Harrold, Upper Heyford (GB); Graham J. Woodgate, Henley-on-Thames (GB)

(73) Assignee: Optovate Limited, Hemel Hempstead (GB)

( * ) Notice: Subject to any disclaimer, the term of this patent is extended or adjusted under 35 U.S.C. 154(b) by 927 days.

(21) Appl. No.: 16/760,144

(22) PCT Filed: Nov. 5, 2018

(86) PCT No.: PCT/GB2018/053201
§ 371 (c)(1),
(2) Date: Apr. 29, 2020

(87) PCT Pub. No.: WO2019/086903
PCT Pub. Date: May 9, 2019

(65) Prior Publication Data
US 2020/0258867 A1   Aug. 13, 2020

(30) Foreign Application Priority Data

Nov. 5, 2017 (GB) .................................... 1718307

(51) Int. Cl.
*G02B 17/08* (2006.01)
*G02B 3/00* (2006.01)
(Continued)

(52) U.S. Cl.
CPC ........ *H01L 25/0753* (2013.01); *G02B 3/0056* (2013.01); *G02B 5/003* (2013.01);
(Continued)

(58) Field of Classification Search
CPC ..... H01L 25/0753; H01L 33/58; H01L 33/44; H01L 25/075; G02B 3/0056; G02B 5/003;
(Continued)

(56) References Cited

U.S. PATENT DOCUMENTS 5,091,288 A   2/1992   Zappella et al.
5,184,114 A   2/1993   Brown
(Continued)

FOREIGN PATENT DOCUMENTS

CN   102859268 A   1/2013
CN   103109226 A   5/2013
(Continued)

OTHER PUBLICATIONS

EP18200530.6—European Search Report of the European Patent Office dated May 23, 2019.
(Continued)

*Primary Examiner* — Balram T Parbadia
(74) *Attorney, Agent, or Firm* — Penny L. Lowry

(57) ABSTRACT

A display apparatus comprises an array of micro-LEDs and an aligned array of catadioptric optical elements wherein the array of micro optics is further aligned to an array of apertures of a low reflection screen. Advantageously such an arrangement provides a display with large images of configurable size, low cost and high brightness that can achieve high contrast in high illuminance from ambient lighting while also achieving high luminous efficiency.

40 Claims, 16 Drawing Sheets

(51) Int. Cl.
- *G02B 5/00* (2006.01)
- *G02B 5/22* (2006.01)
- *G02B 7/00* (2021.01)
- *G02B 19/00* (2006.01)
- *H01L 25/075* (2006.01)
- *H04R 1/02* (2006.01)
- *G09F 9/33* (2006.01)
- *G09G 3/32* (2016.01)

(52) U.S. Cl.
CPC .............. *G02B 5/22* (2013.01); *G02B 7/003* (2013.01); *G02B 17/08* (2013.01); *G02B 19/0028* (2013.01); *G02B 19/0061* (2013.01); *H04R 1/028* (2013.01); *G02B 2003/0093* (2013.01); *G09F 9/33* (2013.01); *G09G 3/32* (2013.01); *H04R 2499/15* (2013.01)

(58) Field of Classification Search
CPC .......... G02B 5/22; G02B 7/003; G02B 17/08; G02B 19/0028; G02B 19/0061; G02B 2003/0093; G02B 5/005; G02B 27/0018; G02B 19/00; G02B 3/00; G02B 5/00; G02B 7/00; H04R 1/028; H04R 2499/15; H04R 1/02; G09F 9/33; G09G 3/32

See application file for complete search history.

(56) References Cited

U.S. PATENT DOCUMENTS

| | | | |
|---|---|---|---|
| 5,812,105 A | 9/1998 | Ven | |
| 6,547,423 B2 | 4/2003 | Marshall et al. | |
| 6,570,324 B1 | 5/2003 | Tutt et al. | |
| 6,987,355 B2 * | 1/2006 | Cok | H10K 59/351 313/506 |
| 7,014,964 B1 | 3/2006 | Hsu et al. | |
| 7,084,435 B2 | 8/2006 | Sugimoto et al. | |
| 7,171,874 B1 | 2/2007 | Huang | |
| 7,863,614 B2 | 1/2011 | Toyama et al. | |
| 7,994,531 B2 | 8/2011 | Lin et al. | |
| 8,721,115 B2 | 5/2014 | Ing et al. | |
| 8,794,792 B1 | 8/2014 | Moghal et al. | |
| 8,985,810 B2 | 3/2015 | Woodgate et al. | |
| 9,519,153 B2 | 12/2016 | Robinson et al. | |
| 9,773,457 B2 | 9/2017 | Peterson et al. | |
| 10,121,772 B1 | 11/2018 | Wu et al. | |
| 10,126,575 B1 | 11/2018 | Robinson et al. | |
| 10,303,030 B2 | 5/2019 | Robinson et al. | |
| 10,533,730 B2 | 1/2020 | Harrold et al. | |
| 10,976,578 B2 | 4/2021 | Robinson et al. | |
| 11,063,193 B2 | 7/2021 | Woodgate et al. | |
| 11,652,195 B2 | 5/2023 | Harrold et al. | |
| 2004/0080938 A1 | 4/2004 | Holman et al. | |
| 2004/0089935 A1 | 5/2004 | Lehner | |
| 2004/0126911 A1 | 7/2004 | Kimura | |
| 2004/0161871 A1 | 8/2004 | Omori | |
| 2004/0192082 A1 | 9/2004 | Wagner et al. | |
| 2004/0218390 A1 | 11/2004 | Holman et al. | |
| 2004/0239243 A1 | 12/2004 | Roberts et al. | |
| 2004/0263061 A1 | 12/2004 | Ishikawa et al. | |
| 2005/0111100 A1 | 5/2005 | Mather et al. | |
| 2005/0219693 A1 | 10/2005 | Hartkop et al. | |
| 2006/0141761 A1 | 6/2006 | Brody et al. | |
| 2006/0152931 A1 | 7/2006 | Holman | |
| 2006/0154393 A1 | 7/2006 | Doan et al. | |
| 2006/0221611 A1 | 10/2006 | Noh et al. | |
| 2006/0252163 A1 | 11/2006 | Yaniv et al. | |
| 2006/0256255 A1 | 11/2006 | Minami | |
| 2006/0258028 A1 | 11/2006 | Paolini et al. | |
| 2006/0290276 A1 | 12/2006 | Cok et al. | |
| 2007/0007237 A1 | 1/2007 | Wu et al. | |
| 2007/0019131 A1 | 1/2007 | Choi et al. | |
| 2007/0047254 A1 | 3/2007 | Schardt et al. | |
| 2007/0116424 A1 | 5/2007 | Ting et al. | |
| 2007/0165394 A1 | 7/2007 | Chang | |
| 2007/0176195 A1 | 8/2007 | Kuiseko et al. | |
| 2007/0236628 A1 | 10/2007 | Epstein | |
| 2007/0242477 A1 | 10/2007 | Yoo et al. | |
| 2007/0256453 A1 | 11/2007 | Barnes et al. | |
| 2008/0043466 A1 | 2/2008 | Chakmakjian et al. | |
| 2008/0089093 A1 | 4/2008 | Miller et al. | |
| 2008/0123350 A1 | 5/2008 | Choe et al. | |
| 2008/0176398 A1 | 7/2008 | Jain et al. | |
| 2008/0225523 A1 | 9/2008 | Samber et al. | |
| 2008/0237612 A1 | 10/2008 | Cok | |
| 2008/0258162 A1 | 10/2008 | Koung et al. | |
| 2008/0285310 A1 | 11/2008 | Aylward et al. | |
| 2008/0315755 A1 | 12/2008 | Han | |
| 2009/0001869 A1 | 1/2009 | Tanimoto et al. | |
| 2009/0073350 A1 | 3/2009 | Toyama et al. | |
| 2009/0086508 A1 | 4/2009 | Bierhuizen | |
| 2009/0109656 A1 | 4/2009 | Chang | |
| 2009/0128735 A1 | 5/2009 | Larson et al. | |
| 2009/0148972 A1 | 6/2009 | Fang et al. | |
| 2009/0180273 A1 | 7/2009 | Kim et al. | |
| 2009/0242929 A1 | 10/2009 | Lin | |
| 2009/0268428 A1 | 10/2009 | Tsukada | |
| 2009/0296389 A1 | 12/2009 | Hsu | |
| 2010/0061096 A1 | 3/2010 | Sato | |
| 2010/0097809 A1 | 4/2010 | Munro et al. | |
| 2010/0165635 A1 | 7/2010 | Chen et al. | |
| 2010/0171215 A1 | 7/2010 | Fischer et al. | |
| 2010/0172152 A1 | 7/2010 | Boonekamp | |
| 2010/0195330 A1 | 8/2010 | Schaefer et al. | |
| 2010/0207852 A1 | 8/2010 | Cok | |
| 2010/0258543 A1 | 10/2010 | Mizuno et al. | |
| 2010/0295762 A1 | 11/2010 | Yeom et al. | |
| 2010/0317132 A1 | 12/2010 | Rogers et al. | |
| 2011/0003410 A1 | 1/2011 | Tsay et al. | |
| 2011/0018860 A1 | 1/2011 | Parry-Jones et al. | |
| 2011/0038150 A1 | 2/2011 | Woodgate et al. | |
| 2011/0090672 A1 | 4/2011 | Zhu et al. | |
| 2011/0151602 A1 | 6/2011 | Speier | |
| 2011/0193114 A1 | 8/2011 | Lerman et al. | |
| 2011/0194034 A1 | 8/2011 | Shimizu | |
| 2011/0255303 A1 | 10/2011 | Nichol et al. | |
| 2012/0020055 A1 | 1/2012 | Ligas et al. | |
| 2012/0038266 A1 | 2/2012 | Moriyama et al. | |
| 2012/0082332 A1 * | 4/2012 | Park | H04R 1/028 381/333 |
| 2012/0086875 A1 | 4/2012 | Yokota | |
| 2012/0119237 A1 | 5/2012 | Leatherdale et al. | |
| 2012/0140462 A1 | 6/2012 | Pickard | |
| 2012/0147296 A1 | 6/2012 | Montgomery et al. | |
| 2012/0193799 A1 | 8/2012 | Sakuma et al. | |
| 2012/0258963 A1 | 10/2012 | Berger et al. | |
| 2012/0268963 A1 | 10/2012 | Gourlay | |
| 2012/0299883 A1 | 11/2012 | Sumida et al. | |
| 2012/0320627 A1 | 12/2012 | Araki et al. | |
| 2013/0033849 A1 | 2/2013 | Roberts et al. | |
| 2013/0039062 A1 | 2/2013 | Vinther et al. | |
| 2013/0094126 A1 * | 4/2013 | Rappoport | G06F 1/1686 361/679.01 |
| 2013/0107525 A1 | 5/2013 | Woodgate et al. | |
| 2013/0121000 A1 | 5/2013 | Lee et al. | |
| 2013/0194812 A1 | 8/2013 | Tseng | |
| 2013/0235580 A1 | 9/2013 | Smith | |
| 2013/0258663 A1 | 10/2013 | Woodgate et al. | |
| 2013/0293793 A1 | 11/2013 | Lu | |
| 2013/0301240 A1 | 11/2013 | Liu et al. | |
| 2014/0016314 A1 | 1/2014 | Woodgate et al. | |
| 2014/0022619 A1 | 1/2014 | Woodgate et al. | |
| 2014/0098418 A1 | 4/2014 | Lin | |
| 2014/0140654 A1 | 5/2014 | Brown et al. | |
| 2014/0186979 A1 | 7/2014 | Tu et al. | |
| 2014/0211462 A1 | 7/2014 | Keller et al. | |
| 2014/0211503 A1 | 7/2014 | Tarsa | |
| 2014/0239326 A1 | 8/2014 | Perng | |
| 2014/0240828 A1 | 8/2014 | Robinson et al. | |
| 2014/0240839 A1 | 8/2014 | Yang et al. | |
| 2014/0268641 A1 | 9/2014 | Tordini | |
| 2014/0299897 A1 | 10/2014 | Zhang et al. | |

(56) References Cited

U.S. PATENT DOCUMENTS

| | | | |
|---|---|---|---|
| 2014/0306612 A1* | 10/2014 | Woodgate | H05B 47/11 |
| | | | 315/153 |
| 2014/0316742 A1 | 10/2014 | Sun et al. | |
| 2015/0023051 A1* | 1/2015 | Jepsen | G09G 3/20 |
| | | | 362/559 |
| 2015/0054011 A1 | 2/2015 | Koizumi et al. | |
| 2015/0062490 A1 | 3/2015 | Kwon | |
| 2015/0160396 A1 | 6/2015 | Wilcox et al. | |
| 2015/0268479 A1 | 9/2015 | Woodgate et al. | |
| 2015/0268513 A1 | 9/2015 | Chang et al. | |
| 2015/0295154 A1 | 10/2015 | Tu et al. | |
| 2015/0308635 A1 | 10/2015 | Li et al. | |
| 2015/0325816 A1 | 11/2015 | Haag et al. | |
| 2016/0018077 A1 | 1/2016 | Mallory et al. | |
| 2016/0203742 A1 | 7/2016 | Peterson et al. | |
| 2016/0211413 A1 | 7/2016 | Park et al. | |
| 2016/0299281 A1 | 10/2016 | Robinson et al. | |
| 2016/0349437 A1 | 12/2016 | Peterson et al. | |
| 2017/0031085 A1 | 2/2017 | Lim et al. | |
| 2017/0045666 A1 | 2/2017 | Vasylyev | |
| 2017/0059127 A1 | 3/2017 | Jansma et al. | |
| 2017/0102127 A1 | 4/2017 | Woodgate et al. | |
| 2017/0139114 A1 | 5/2017 | Woodgate et al. | |
| 2017/0154919 A1 | 6/2017 | Chen et al. | |
| 2017/0161179 A1 | 6/2017 | Maple et al. | |
| 2017/0205959 A1 | 7/2017 | Seong | |
| 2017/0219883 A1 | 8/2017 | Yin | |
| 2017/0248289 A1 | 8/2017 | Vasylyev | |
| 2017/0254518 A1 | 9/2017 | Vasylyev et al. | |
| 2017/0261179 A1 | 9/2017 | Wu et al. | |
| 2018/0014007 A1 | 1/2018 | Brown | |
| 2018/0022881 A1 | 1/2018 | Seki et al. | |
| 2018/0052524 A1 | 2/2018 | Peterson et al. | |
| 2018/0135831 A1 | 5/2018 | Smith et al. | |
| 2018/0190625 A1* | 7/2018 | Steckel | H01L 33/60 |
| 2018/0226384 A1 | 8/2018 | Park et al. | |
| 2018/0245776 A1 | 8/2018 | Gladden et al. | |
| 2018/0277523 A1 | 9/2018 | Ahmed et al. | |
| 2018/0321553 A1 | 11/2018 | Robinson et al. | |
| 2018/0328581 A1 | 11/2018 | Komanduri et al. | |
| 2018/0329245 A1 | 11/2018 | Robinson et al. | |
| 2019/0086706 A1 | 3/2019 | Robinson et al. | |
| 2019/0113727 A1 | 4/2019 | Tamma et al. | |
| 2019/0139243 A1 | 5/2019 | You et al. | |
| 2019/0215509 A1 | 7/2019 | Woodgate et al. | |
| 2019/0220121 A1 | 7/2019 | Kim et al. | |
| 2019/0250458 A1 | 8/2019 | Robinson et al. | |
| 2019/0257497 A1 | 8/2019 | Harrold et al. | |
| 2019/0265478 A1 | 8/2019 | Cok et al. | |
| 2019/0278135 A1 | 9/2019 | Woodgate et al. | |
| 2019/0294004 A1 | 9/2019 | Hashimoto | |
| 2019/0324184 A1 | 10/2019 | Cai et al. | |
| 2019/0377067 A1 | 12/2019 | Han et al. | |
| 2019/0378744 A1 | 12/2019 | Liu et al. | |
| 2020/0049876 A1 | 2/2020 | Watanabe et al. | |
| 2020/0096171 A1 | 3/2020 | Han et al. | |
| 2020/0124834 A1 | 4/2020 | Woodgate et al. | |
| 2020/0127169 A1 | 4/2020 | Ahmed | |
| 2020/0150408 A1 | 5/2020 | Fard et al. | |
| 2020/0159055 A1 | 5/2020 | Robinson et al. | |
| 2020/0166783 A1 | 5/2020 | Roy et al. | |
| 2020/0249531 A1 | 8/2020 | Adeyshvili et al. | |
| 2020/0259307 A1 | 8/2020 | Sharma et al. | |
| 2020/0309341 A1 | 10/2020 | Fleszewski et al. | |
| 2020/0321553 A1 | 10/2020 | Kwon et al. | |
| 2020/0355896 A1 | 11/2020 | Woodgate et al. | |
| 2021/0302650 A1 | 9/2021 | Song et al. | |
| 2022/0404540 A1 | 12/2022 | Robinson et al. | |

FOREIGN PATENT DOCUMENTS

| | | |
|---|---|---|
| CN | 103117348 A | 5/2013 |
| CN | 105556374 A | 5/2016 |
| CN | 105849595 A | 8/2016 |
| CN | 107402475 A | 11/2017 |
| CN | 108287438 A | 7/2018 |
| CN | 112394449 A | 2/2021 |
| DE | 102010031945 A1 | 1/2012 |
| DE | 102012109052 A1 | 12/2013 |
| EP | 1387412 A1 | 2/2004 |
| EP | 1835550 A2 | 9/2007 |
| EP | 1890343 A1 | 2/2008 |
| EP | 1956423 A1 | 8/2008 |
| EP | 1986023 A1 | 10/2008 |
| EP | 2182783 A2 | 5/2010 |
| EP | 2595295 A1 | 5/2013 |
| EP | 2824387 A1 | 1/2015 |
| EP | 3762757 A1 | 1/2021 |
| GB | 2405542 A | 3/2005 |
| GB | 2464102 A | 4/2010 |
| GB | 2484711 A | 4/2012 |
| GB | 2496183 A | 5/2013 |
| JP | H11266035 A | 9/1999 |
| JP | 2000323755 A | 11/2000 |
| JP | 2007294411 A | 11/2007 |
| JP | 2009152161 A | 7/2009 |
| JP | 2009295309 A | 12/2009 |
| JP | 2010205698 A | 9/2010 |
| JP | 2010238846 A | 10/2010 |
| JP | 2013219397 A | 10/2013 |
| JP | 2015533713 A | 11/2015 |
| JP | 2018022683 A | 2/2018 |
| KR | 20090106062 A | 10/2009 |
| KR | 20190053312 A | 5/2019 |
| WO | 2005071474 A2 | 8/2005 |
| WO | 2006115313 A1 | 11/2006 |
| WO | 2007069198 A2 | 6/2007 |
| WO | 2007074932 A1 | 7/2007 |
| WO | 2008080165 A2 | 7/2008 |
| WO | 2008109296 A1 | 9/2008 |
| WO | 2010038025 A2 | 4/2010 |
| WO | 2010038025 A3 | 6/2010 |
| WO | 2011131200 A1 | 10/2011 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014043384 A1 | 3/2014 |
| WO | 2015089517 A1 | 6/2015 |
| WO | 2016044284 A1 | 3/2016 |
| WO | 2017007770 A2 | 1/2017 |
| WO | 2017169123 A1 | 10/2017 |
| WO | 2018040708 A1 | 3/2018 |
| WO | 2018185475 A1 | 10/2018 |
| WO | 2018185476 A1 | 10/2018 |
| WO | 2018208618 A1 | 11/2018 |
| WO | 2018231344 A1 | 12/2018 |
| WO | 2019067846 A1 | 4/2019 |
| WO | 2019107826 A1 | 6/2019 |
| WO | 2019173816 A1 | 9/2019 |

OTHER PUBLICATIONS

International search report and written opinion of international searching authority for PCT application PCT/ GB2018/050893 mailed Aug. 27, 2018.

International search report and written opinion of international searching authority for PCT application PCT/GB2018/050894 dated Aug. 27, 2018.

International search report and written opinion of international searching authority for PCT application PCT/GB2019/050076 dated May 9, 2019.

International search report and written opinion of international searching authority for PCT application PCT/US2019/021570 dated May 24, 2019.

International search report and written opinion of international searching authority for PCT application PCT/US2019/031526 dated Jul. 29, 2019.

International search report and written opinion of international searching authority for PCT application PCT/US2020/040686 dated Nov. 20, 2020.

(56) References Cited

OTHER PUBLICATIONS

International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2020/050527 dated Feb. 3, 2021.
International search report and written opinion of international searching authority for PCT application PCT/US2020/053825 dated Dec. 30, 2020.
CN201980016364.X Notification of the First Office Action dated Dec. 27, 2021.
EP19804311.9—Extended European Search Report of the European Patent Office dated Dec. 15, 2021.
PCT/US2022/034145 International search report and written opinion of the international searching authority dated Oct. 6, 2022.
CN201980030275.0 Notification of the First Office Action dated Mar. 4, 2022.
CN201880036805.8 Notification of the First Office Action dated Jul. 23, 2021.
CN201880036842.9 Notification of the First Office Action dated Jul. 23, 2021.
EP-20835231.0 Extended European Search Report of European Patent Office dated May 15, 2023.
JP2020-571342 Non-Final Notice of Reasons for Rejection dated Apr. 4, 2023.
EP18200530.6 Notification of the First Office Action dated Jun. 21, 2023.
EP20856156.3 Extended European Search Report of European Patent Office dated Aug. 11, 2023.
International search report and written opinion of international searching authority for PCT application PCT/US2021/018544 dated Apr. 29, 2021.
CN202080059812.7 Notification of the First Office Action dated Oct. 19, 2023.
EP18715949.6 Notification of the First Office Action dated Sep. 21, 2023.
EP19763362.1 Notification of the First Office Action dated Oct. 12, 2023.
EP19804311.9 Notification of the First Office Action dated Sep. 11, 2023.
EP20863341.2 Extended European Search Report of European Patent Office dated Sep. 18, 2023.
EP20872979.8 Extended European Search Report of European Patent Office dated Oct. 19, 2023.
PCT/US2023/024329 International search report and written opinion of the international searching authority dated Sep. 6, 2023.
EP20872718.0 Extended European Search Report of European Patent Office dated Jan. 2, 2024.
EP21758026.5 Extended European Search Report of European Patent Office dated Feb. 14, 2024.
EP23218625.4 Extended European Search Report of European Patent Office dated Feb. 23, 2024.
JP2022-519797 Non-Final Notice of Reasons for Rejection dated Apr. 23, 2024.
KR10-2020-7035806 Notice of Preliminary Rejection mailed Mar. 18, 2024.

* cited by examiner

DISPLAY APPARATUS

TECHNICAL FIELD

The present disclosure relates to a display apparatus comprising a plurality of addressable light-emitting elements aligned to a plurality of catadioptric optical elements and a low reflectivity screen. Such an apparatus may be used for indoor or outdoor electronic display screens such as for large display sizes including TV, cinema and billboard display for use in high ambient illumination environments and to achieve very high contrast ratios.

BACKGROUND

The front surface of known display screens can be fitted with an AR (anti reflection coating) layer. AR coatings can increase perceived image contrast by reducing reflected luminance of ambient light sources from the display surface. However, it can be expensive to provide AR layers that cancel reflections uniformly at all visible wavelengths and such coatings can be susceptible to damage.

An alternative approach is to provide an AG (anti-glare) layer comprising a diffusing front surface. The AG layer diffuses the reflected image of ambient light sources illuminating the display, so that they cannot be clearly resolved as an object by the viewer. Light from point sources is spread over an increased area achieving more uniform image contrast across the display area. The diffused light undesirably provides light in low luminance regions of the image, degrading the contrast performance of the display. The AG coating also blurs the image pixels, undesirably reducing perceived image resolution.

Inorganic LEDs formed by semiconductor growth onto monolithic wafers demonstrate high levels of luminous efficiency (lm/W) and high luminous emittance (lm/mm$^2$). The source size is defined by the area of LED die, and so in principle can be made of arbitrary size up to the size of the monolithic wafer. In cooperation with light conversion layers, LEDs may provide acceptable CIE Colour Rendering Indices (CM) or colour space coverage.

Organic light-emitting diodes (OLEDs) can be formed on arbitrarily large substrates, however luminous emittance may be more than 1000 times lower than may be achieved by inorganic LEDs.

In this specification LED refers to an unpackaged LED die chip extracted directly from a monolithic wafer, i.e. a semiconductor element. This is distinct from packaged LEDs in which the LED die has been attached to a lead frame in order to provide electrodes and may be assembled into a plastic package to facilitate subsequent automated assembly.

Packaged LEDs are typically of dimension greater than 1 mm, and more typically of dimension greater than 3 mm and can be assembled by conventional Printed Circuit Board assembly techniques including pick and place methods. The accuracy of components placed by such assembly machines may typically be about plus or minus 30 microns. Such sizes and tolerances limit application to high resolution displays. LED displays for outdoor use are often constructed of packaged LED chips embedded in a black plastic resin in order to suppress background light reflections and thereby increase the overall contrast and viewing quality of the display. The black resin material absorbs a substantial amount of the emitted light, which reduces the efficiency and increases overall power consumption of the display.

Micro-LEDs may be formed by array extraction methods wherein multiply: LEDs are removed from a monolithic wafer in parallel. Micro-LEDs may have dimensions that are less than 300 microns, preferably less than 200 microns and more preferably less than 100 microns and may be arranged with positional tolerances that are less than 5 microns and can be used to provide high resolution displays and local dimming backlights.

BRIEF SUMMARY

According to a first aspect of the present disclosure there is provided a display apparatus, comprising: at least one image pixel array relay structure comprising: a plurality of micro-LEDs arranged to output light, the plurality of micro-LEDs being arranged in a micro-LED array; and a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; and a low reflection screen comprising a light absorbing structure arranged on a side of a transparent support substrate wherein the light absorbing structure comprises a plurality of light transmitting apertures arranged in an aperture array, the transparent support substrate being arranged between the image pixel array relay structure and the light absorbing structure; wherein the at least one image pixel array relay structure and the low reflection screen are aligned such that the light from each of the micro-LEDs and its respective aligned catadioptric optical element is relayed to at least one of the light transmitting apertures. The display apparatus may further comprise a control system arranged to provide the plurality of micro-LEDs with image data.

Advantageously a display may be provided with high contrast in brightly illuminated environments and high luminous efficiency and high luminance. Reflections from electronic and optical components may be minimised and high display uniformity may be provided. Fast display operation may be provided for high frame rate operation. Power consumption for large area displays may be minimised. Operation with high contrast in high ambient luminance environments may be achieved.

The display apparatus may further comprise at least one alignment structure arranged to align the plurality of catadioptric optical elements with the plurality of light transmitting apertures. The display may be conveniently aligned at low cost and complexity to advantageously achieve high uniformity images.

The plurality of micro-LEDs may be arranged on a backplane substrate and the plurality of catadioptric optical elements is arranged on an optical substrate. Advantageously the image pixel array relay structure may be provided over large areas with high uniformity and low cost of assembly.

The display apparatus may comprise at least two image pixel array relay structures wherein the image pixel array relay structures are tiled, and the low reflection screen is aligned to the at least two image pixel array relay structures. Advantageously a display area that is larger than is conveniently manufactured on a single substrate may be provided without the visibility of seams between the tiled structures. The display may be scaled to arbitrary size and may be assembled at a location different to the factory. Cost of large area displays may be reduced.

A diffuser may be arranged between the light transmitting aperture regions and the transparent support substrate. Advantageously variations of luminance with viewing angle may be controlled, to provide uniform display appearance over desired viewer geometries.

A plurality of lenses may be arranged between the catadioptric optical element array and the transparent support substrate. The plurality of lenses may be arranged on at least one of the optical substrate and the transparent support substrate. Advantageously the tolerance of alignment of the pixel array relay structure to the light transmitting aperture regions may be reduced during an alignment step. Cost of assembly may be reduced.

Each of the plurality of lenses may be arranged to receive light from at least two micro-LEDs of the plurality of micro-LEDs. Advantageously misalignments may be corrected by control of micro-LED drive signals, Further, increased dynamic range may be provided.

The alignment structure may further comprise a structure support member arranged to provide mechanical fixing between the image pixel array relay structure and the low reflection screen. Advantageously robust alignment of the pixel array relay structure and the low reflection screen may be provided, achieving increased uniformity and reliable alignment.

The average reflectance to white light of the light absorbing structure is less than 4%, preferably less than 2% and most preferably less than 1%. Advantageously a high contrast image may be provided for high levels of ambient illuminance. Power consumption may be reduced for a desirable contrast ratio.

The light absorbing structure may comprise a microstructured surface. The microstructured surface may comprise a corner cube retro-absorber structure or may comprise a comb structure with high area for absorbing frontally reflected light. Advantageously front of screen reflections may be reduced, increasing display contrast.

The low reflection screen may be further provided with acoustic apertures. The acoustic apertures may comprise an array of holes to transmit sound. The array of holes may have a profile arranged to reduce light transmission from the image pixel array relay structure. Acoustic transducers may be provided on the at least one image pixel array relay structure. Advantageously sound may be provided from locations over the display surface that is associated with displayed image data.

A wavelength conversion layer and/or colour filter may be arranged between at least one light transmitting aperture region and the transparent support substrate. Advantageously the temperature of the wavelength conversion layer may be reduced in comparison to wavelength conversion layers that are formed on the plurality of micro-LEDs.

The plurality of micro-LEDs may provide blue light and at least one wavelength conversion layer is arranged to convert blue light into yellow or green or red light. Advantageously increased display efficiency may be achieved.

The plurality of micro-LEDs may provide white light and red, green and blue colour filters are provided respectively in different light transmitting aperture regions. Advantageously increased colour gamut may be achieved.

Each of the catadioptric optical elements of the plurality of catadioptric optical elements may comprise, in at least one cross-sectional plane through its optical axis: a first outer surface and a second outer surface facing the first outer surface; wherein the first and second outer surfaces extend from a first end of the catadioptric optical element to a second end of the catadioptric optical element, the second end of the catadioptric optical element facing the first end of the catadioptric optical element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces. The alignment in correspondence between a catadioptric optical element of the plurality of catadioptric optical elements and its respective one or more of the micro-LEDs of the plurality of micro-LEDs comprising the respective one or more of the micro-LEDs of the plurality of micro-LEDs may be positioned at the first end of the catadioptric optical element and aligned with the catadioptric optical element or positioned between the first end of the catadioptric optical element and the at least one transparent inner surface of the catadioptric optical element and aligned with the catadioptric optical element. The cross-section from one side to the other side of the micro-LED may be aligned within the first end of the catadioptric optical element, In the at least one catadioptric cross-sectional plane, the exterior angle between the first end and the first and second outer surfaces at the first end is less than the exterior angle between the first end and the first and second outer surface at the second end. In the at least one catadioptric cross-sectional plane at least one of the transparent inner surfaces may have positive optical power. In the at least one catadioptric cross-sectional plane at least one of the transparent inner surfaces may have zero optical power. In the at least one catadioptric cross-sectional plane some of the light output of micro-LEDs of the plurality of micro-LEDs may be transmitted by the at least one transparent inner surface before it is reflected at the first or second outer surfaces and directed into the first directional light output distribution; and some of the light output of the micro-LEDs of the plurality of micro-LEDs may be transmitted by the at least one transparent inner surface and directed into the first directional light output distribution without reflection at the first or second outer surfaces. A refractive optical element may be provided between the micro-LEDs of the plurality of micro-LEDs and the at least one transparent inner surface. The refractive optical element may be a hemispherical lens.

Advantageously light from the micro-LED may be efficiently collected by the aligned catadioptric optical element and relayed towards the screen.

The width or diameter of the micro-LEDs may be less than 300 microns, preferably less than 200 microns and more preferably less than 100 microns. In the at least one catadioptric cross-sectional plane the distance between the first and second outer surfaces at the second end of the catadioptric optical element may be less than 3 mm, preferably less than 1.5 mm and more preferably less than 0.75 mm. Advantageously a high resolution display may be provided with high image contrast.

The plurality of micro-LEDs may comprise inorganic micro-LEDs. Advantageously micro-LEDs with high luminous emittance and high luminous efficiency may be provided and a high luminance efficient display may be achieved.

The plurality of micro-LEDs may further comprise a wavelength converting layer. The wavelength converting layer may comprise a phosphor material or a quantum dot material. Advantageously efficient colour light emission may be provided.

The micro-LEDs of the plurality of micro-LEDs may be from a monolithic wafer arranged in an array with their original monolithic wafer positions and orientations relative to each other preserved; and wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs. Advantageously the plurality of micro-LEDs may be provided over a large area with low cost.

The second end of at least one catadioptric optical element of the plurality of catadioptric optical elements may be arranged on the first side of an optical element support substrate. Advantageously the plurality of catadioptric optical elements may be provided over a large area with low cost. Alignment to the plurality of micro-LEDs may be provided with a small number of alignment steps and thus be provided with low cost.

The catadioptric optical elements of the plurality of catadioptric optical elements may comprise a material transparent to at least one operating wavelength of at least one element of the plurality of micro-LEDs. The cross-section from one side to the other side of the micro-LED may be aligned within the first end of the catadioptric optical element. Advantageously a high efficiency display may be provided.

According to a second aspect of the present disclosure, a composite display apparatus may comprise at least two tiled display apparatuses of the first aspect.

Advantageously a display apparatus can be provided with a low reflectivity screen that is larger than the size of an individual low reflectivity screen. A display with large display area can thus be conveniently assembled without highly visible seams at a location remote from the factory.

These and other features and advantages of the present disclosure will become apparent to those of ordinary skill in the art upon reading this disclosure in its entirety.

BRIEF DESCRIPTION OF THE DRAWINGS

Embodiments are illustrated by way of example in the accompanying figures, wherein like reference numbers indicate similar parts.

DETAILED DESCRIPTION

It would be desirable to provide a high contrast display for use outdoors, in brightly illuminated indoor environments, auditorium display, cinema display, home viewing, control room or command post and in other environments where stray light incident on the display may degrade image contrast. In such environments ambient light reflections may degrade front of screen contrast levels, obscuring low black levels that may otherwise be achievable.

In use, ambient light sources may degrade display contrast by providing reflected illumination in regions of the display that are intended to provide low luminance. In brightly lit environments ambient light sources may be provided by external illumination. In outdoor environments reflections may come for example from the sun, the sky, or from street or building lighting. In indoor office environments, reflections may come for example from windows, from other displays or from internal lighting. In darkly lit environments, the ambient light sources may be provided by light from the display that is reflected from the display users and/or surrounding environment for example off walls, ceiling or the face and clothing of the viewers or observers.

It would be desirable to optimise display perceived contrast when operating in an environment with high ambient illumination while achieving high efficiency and low thickness.

Figure 1:
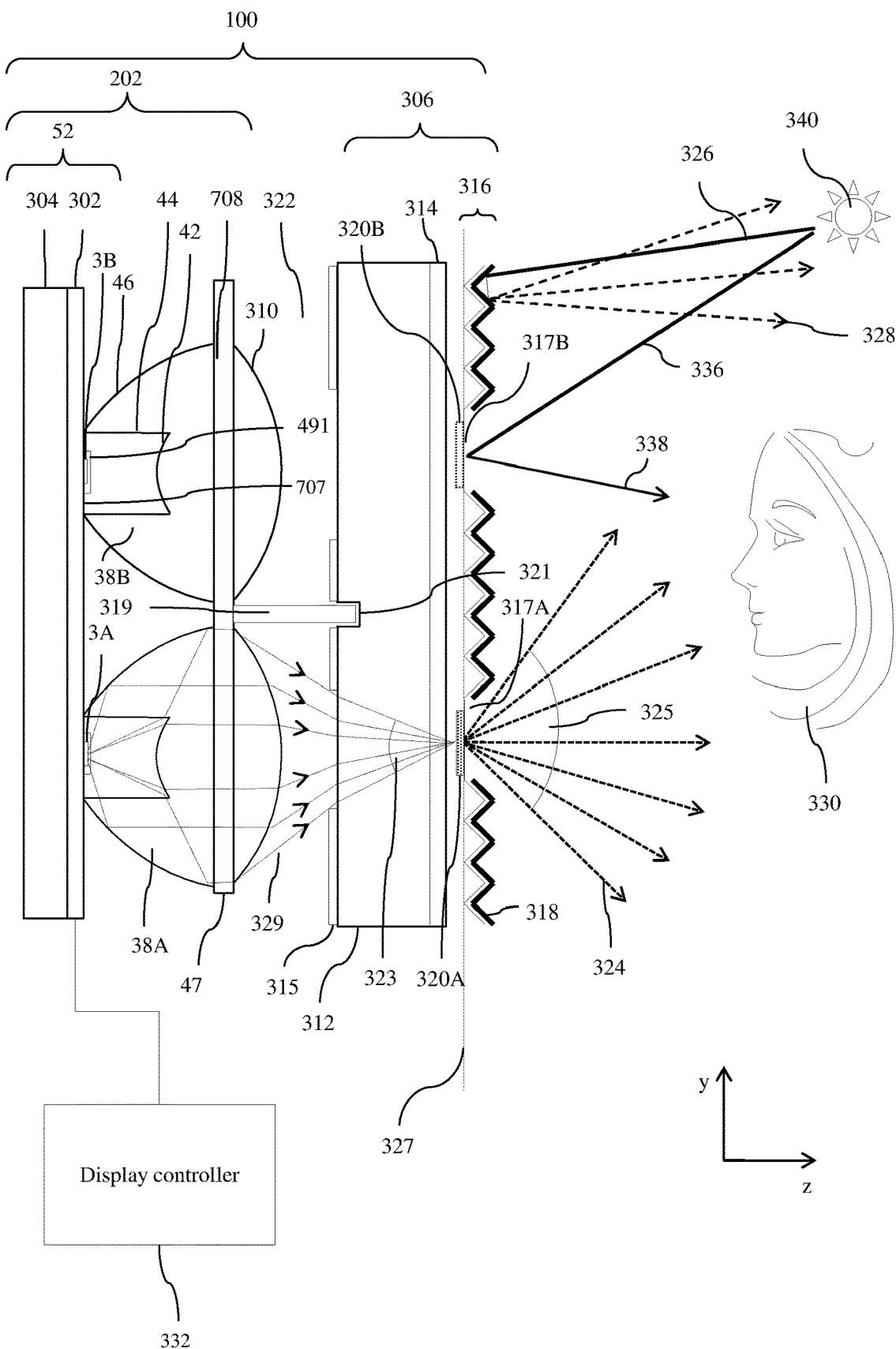
FIG. 1 is a schematic diagram illustrating in side view a display apparatus comprising an array of light sources, aligned array of catadioptric optical elements, aligned array of optical apertures and a low reflection screen.

FIG. 1 is a schematic diagram illustrating in side view a high contrast display apparatus 100 comprising an image pixel array relay structure 202 and a low reflection screen 306.

Display apparatus 100 comprises an image pixel array relay structure 202 comprising: a plurality of micro-LEDs 3 comprising micro-LEDs 3A, 3B arranged to output light as light rays 329. The plurality of micro-LEDs 3A, 3B are arranged in a micro-LED array.

A plurality of catadioptric optical elements 38A, 38B is arranged in a catadioptric optical element array, wherein each of the catadioptric optical elements 38A, 38B of the plurality of catadioptric optical elements is aligned in correspondence with a respective one or more of the micro-LEDs 3A, 3B of the plurality of micro-LEDs. The micro-LEDs 3 are further aligned with the first end 707 of at least one of the catadioptric optical element 38.

Further each of the micro-LEDs 3A, 3B of the plurality of micro-LEDs is aligned with only a respective one of the catadioptric optical elements 38A, 38B of the plurality of catadioptric optical elements 38A, 38B.

The second end 708 of at least one catadioptric optical element 38 of the plurality of catadioptric optical elements is arranged on the first side of an optical element support substrate 47. Optical element support substrate 47 may further comprise array of converging lenses 310, each lens aligned to the second end 708 of the respective catadioptric optical element 308.

A low reflection screen 306 comprises a light absorbing structure 316 arranged on a side of a transparent support substrate 312 wherein the light absorbing structure 316 comprises a plurality of light transmitting apertures 317 arranged in an aperture array.

The transparent support substrate 312 is arranged between the image pixel array relay structure 202 and the light absorbing structure 316.

The at least one image pixel array relay structure 202 and the low reflection screen 306 are aligned such that the light rays 329 from each of the micro-LEDs 3A, 3B and its respective aligned catadioptric optical element 38A, 38B is relayed to the respective aligned light transmitting apertures 317A, 317E that may be in aperture plane 327.

Alignment structure 319 is arranged to align the plurality of catadioptric optical elements 38A, 38B with the plurality of light transmitting apertures 317A, 317B.

Image pixel array relay structure 202 may comprise an array of micro-LEDs 3, aligned array of catadioptric optical elements 38, aligned array of converging lenses 310 and an aligned array of optical apertures 317.

The plurality of catadioptric optical elements 38A, 38B is arranged on transparent optical substrate 47. The catadioptric optical elements 38 of the plurality of catadioptric optical elements 38 comprise a material transparent to at least one operating wavelength of at least one element of the plurality of micro-LEDs 3. The material may for example be an acrylate such as PMMA, may be a polycarbonate or other known transparent polymer or glass material.

Figure 3:
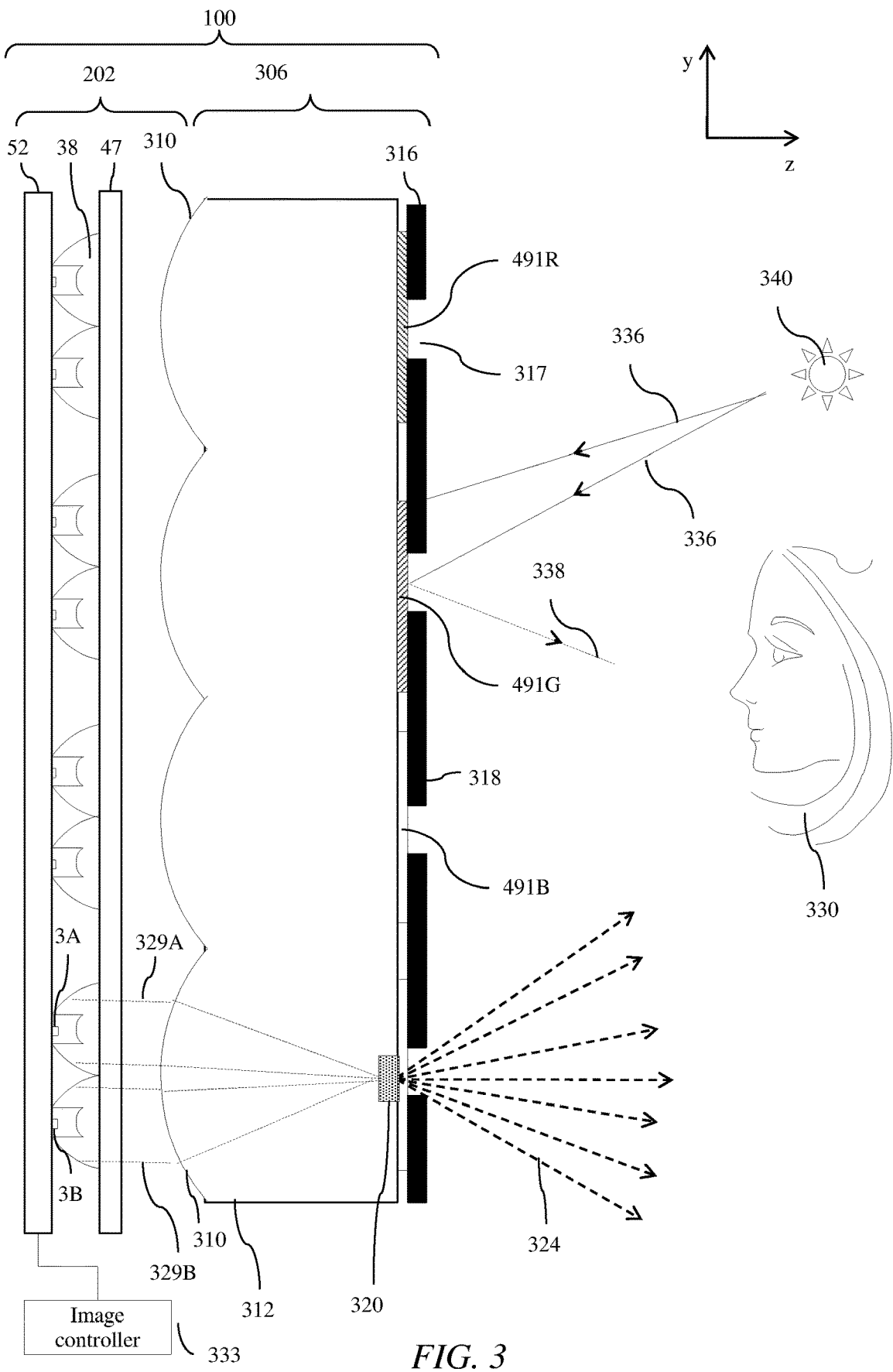
FIG. 3 is a schematic diagram illustrating in a side view a display apparatus wherein light from more than one micro-LED is relayed in to each optical aperture of the low reflection screen.
Figure 4:
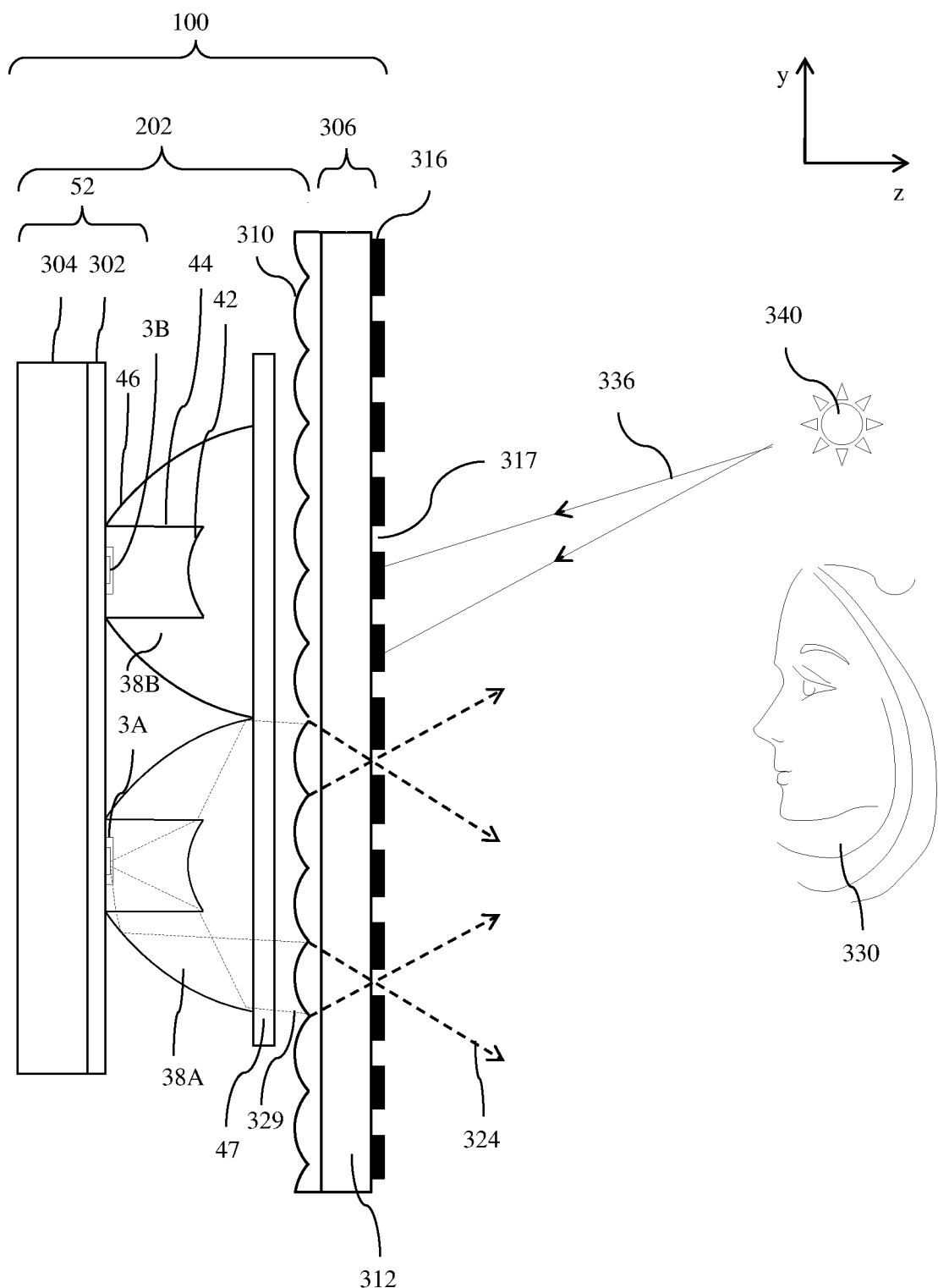
FIG. 4 is a schematic diagram illustrating in a side view a display apparatus wherein light from a micro-LED is relayed in to multiple light transmitting apertures of the low reflection screen.

A plurality of lenses 310 is arranged between the catadioptric optical element array 38 and the transparent support substrate 312. In FIG. 1, the plurality of lenses 310 is arranged on the optical substrate 47, in other embodiments such as illustrated in FIGS. 3 and 4 below the lenses 310 may be arranged on the transparent support substrate 312.

In operation light from the array of micro-LEDs 3 is collected by an aligned array catadioptric optical elements 38 and transmitted through transmitting optical substrate 47 and refractive lens surface 310 so that illumination region 320 is formed from light from micro-LED 3 in aperture 317 of screen 306. In other words, light rays 322 from the micro-LED 3 and respective aligned catadioptric optical element 38 is substantially collimated by the catadioptric optical element 38 as will be described further below. Converging lenses 310 direct the collimated light output to an illumination region 320 that may be in the plane of a diffuser layer 314.

Catadioptric optical elements 38 operate by means of refraction and reflection as will be described further below. In comparison to refractive lenses, such optical elements 38 are non-imaging, so the region 320 may not be directly an image of the micro-LED 3. However, they efficiently relay the output light rays 329 from the respective aligned micro-LED 3 to an angular distribution, typically with a narrow cone angle.

Lenses 310 may be further arranged to provide a small illumination region 320 with small size in comparison to the width of the catadioptric optical element 38 and/or lens 310. Thus, the relayed light output distribution comprises illuminated regions 320A, 320B at the aperture plane 327 with the plurality of light transmitting apertures 317 of the low reflection screen 306. Advantageously, the illumination uniformity of regions 320 can be improved due to reduced optical aberrations in the image pixel relay optical system. In comparison to refractive optics or reflective optics, catadioptric optical elements 38 and lenses 310 may achieve efficient illumination of regions 320 with high efficiency and small size of region 320.

Figure 2:
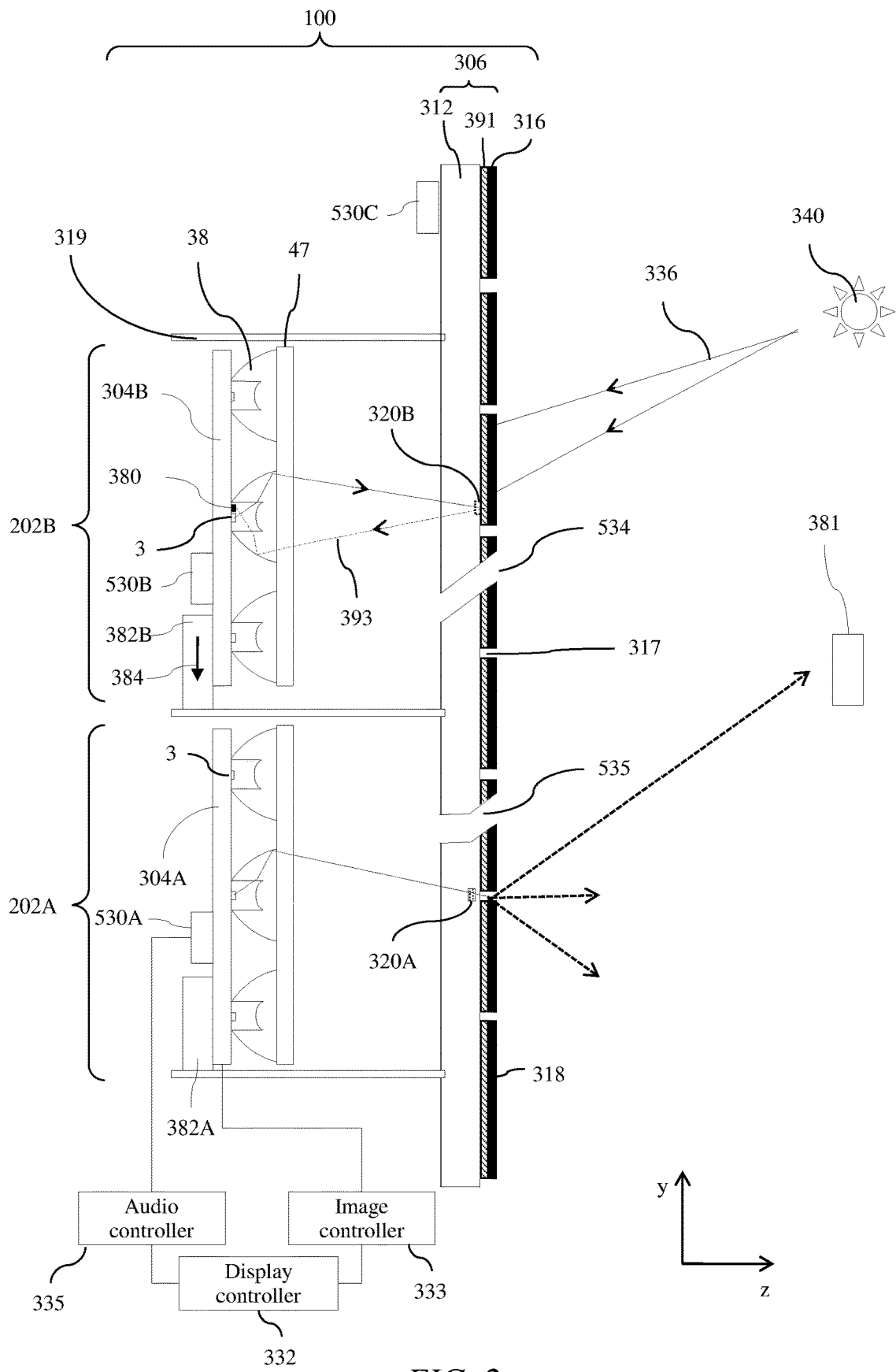
FIG. 2 is a schematic diagram illustrating in a side view a display apparatus comprising an array of light sources and aligned array of catadioptric optical elements that are arranged in panels behind a low reflectivity screen.

Alternatively, as illustrated in FIG. 2, below the converging lenses 310 may be omitted and the refractive and reflective surfaces of the catadioptric element 38 arranged to provide illumination regions 320. Advantageously reduced alignment steps are used during the fabrication of the image pixel array relay structure 202.

The micro-LED 3 array and backplane 52 will now be described in further detail.

In the present disclosure, micro-LEDs refers to light emitting diode elements (LEDs) that have a maximum dimension of 300 micrometres, preferably less than 200 micrometres and more preferably less than 100 micrometres.

The plurality of micro-LEDs 3A, 3B is arranged on a backplane substrate 52. The micro-LEDs 3 are arranged in an electrically addressable array on a backplane substrate 52. Control system 332 is arranged to provide the plurality of micro-LEDs 3A, 3B with image data. Advantageously an addressable display may be provided.

Backplane substrate 52 may further comprise a support layer 304, which may for example be glass or a ceramic or a highly heat conductive material such as aluminium as will be described further below. Backplane layer 302 may further comprise electrical and thermal connections to the micro-LEDs 3, insulating layers and patterned metal such as copper or aluminium electrodes which also function as a heat conductor. Electrical connections may be provided to display controller 332, arranged to drive the micro-LEDs with pixel data in correspondence to their location across the display surface.

The plurality of micro-LEDs 3 may further comprise a wavelength converting layer 491 that may be a phosphor material or a quantum dot material. The wavelength converting layer 491 may be formed on the micro-LEDs 3.

The low reflection screen 306 may comprise transparent substrate 312, diffuser layer 314, and a surface relief light absorbing structure 316 with apertures 317.

Low reflection screen 306 may comprise support substrate 312 which may be a transparent substrate. The alignment structure further comprises a structure support member 319 arranged to provide mechanical fixing between the image pixel array relay structure 202 and the low reflection screen 306. Alignment of the image pixel array relay structure 202 to the apertures 317 of the screen 306 may be provided by optional structure support member 319 between the transparent substrates 47, 312. Support members 319 may align with alignment holes 321 that may be arranged on either substrate 47, 312.

Cross talk from scatter between adjacent micro-LED light directing paths may be reduced by means of absorbing regions 315 that are arranged on the substrate 312 between the transparent substrate 312. and image pixel array relay structure 202. Advantageously substrate 312 may function as a support or stiffener for the screen 306.

Light from the micro-LED 3 is thus provided to user 330 through the screen 306 as image pixel data determined by display controller 332. Such illumination can transfer very high luminance from the micro-LED surface to the front of display apparatus 100. Advantageously, high image luminance can be achieved by the image pixel array relay structure 202.

It may be desirable to provide a large viewing angle for the display. The cone of light that is incident onto the region 320 may have a relatively small cone angle 323. The display apparatus 100 further comprises a diffuser layer 314 arranged between the light transmitting aperture regions and the transparent support substrate. Diffuser layer 314 may provide a larger output cone angle 325 for light in the region 320. Advantageously display uniformity may be increased over large areas. For example, the diffuser 314 may provide a Lambertian or near Lambertian output for light input directed to the region 320.

Alternatively, diffuser layer 314 may be arranged with a plurality of diffuser regions at the apertures 317. Scatter from light incident on the regions of between the apertures 317 may be reduced. Advantageously optical cross talk between adjacent apertures 317 is reduced and increased pixel fidelity achieved.

The screen 306 comprises a light absorbing structure 316 that may be a micro-structured surface such as corner cube structure that may be formed with a light absorbing material and/or may comprise a light absorbing layer 318 formed on the surface of a microstructured surface.

In operation, the display apparatus 100 is illuminated by ambient light source 340. Light source 340 may be provided by external lighting, or may be reflected lighting that is emitted by the display apparatus 100 and reflected by the surrounding environment, such as the faces of the viewer 330.

Ambient light rays 328 are incident on the light absorbing structure 316 undergo incidence on multiple surfaces of the light absorbing structure 316, at each surface ambient reflection is reduced. As will be described further below, when the surface of the light absorbing structure 316 comprises a light absorbing material then the double reflection increases the attenuation of reflected light rays 328. By comparison, apertures 317 have increased reflectivity of light rays 336 such that the luminance per unit area of rays 338 is higher than the luminance per unit area of rays 328. However, the area of apertures 317 is substantially lower than the area of the intermediate light absorbing structure 316 such that the overall reflectivity is mostly provided by the reflectivity of light rays 328. Advantageously, low frontal reflectivity is provided and display contrast substantially increased while achieving high output efficiency for light from the plurality of micro-LEDs 3.

It would be desirable to increase image contrast and increase uniformity of image contrast. In the present embodiments, the light absorbing structure 316 has an average reflectivity to of white light of less than 4%, preferably less than 2% and most preferably less than 1%.

Illustrative embodiments will now be described.

In an illustrative example for a television application the display 100 with average front surface reflectivity of 1% may be illuminated by 100 lux, for example in a domestic viewing environment. The micro-LED 3 of FIG. 1 may be provided to illuminate region 320 such that the luminance from the aperture 317 is of the order of 100,000 nits. The area of the region 320 may be 1% of the total area of the screen 306, thus the area averaged peak luminance seen by observer 330 is 1000 nits. The reflectance of region 317 may be similar to that of conventional display diffusers, however the reflectance of light absorbing structure 316 may for example be less than 1% and may reflect less than 0.32 nits in a 100 lux ambient illumination environment for Lambertian illuminance.

The perceived visual contrast is the contrast ratio of the display including both black state display luminance in zero ambient illuminance and front of screen reflectivity. In the present illustrative embodiment, the black state display luminance is zero (as the micro-LEDs 3 are switched off). Such a display may achieve a perceived visual contrast ratio of greater than 3000:1.

By way of comparison a conventional LCD display at 1000 nits peak luminance in a 100 lux ambient illuminance may have an optical mode contrast ratio in zero ambient illuminance of 2000:1, and with a front surface layer refractive index of 1.5 and a 4% front reflectivity so that a perceived visual contrast of approximately 560:1 may be provided. Advantageously the present embodiments achieve substantially improved black levels in rooms with typical ambient illuminance.

In an illustrative embodiment for an outdoors application, the light absorbing structure 316 has an average reflectivity of light absorbing structure of less than 1% and is illuminated by ambient light rays 328 from a white light Lambertian source with an illuminance of 10,000 lux(lumen/m$^2$). The display 100 is arranged to provide an output luminance of 2000 nits (lumen/steradian·m$^2$). The luminance of reflected light rays 338 from the screen is 32 nits.

In the present illustrative embodiment, the black state display luminance is zero and a perceived visual contrast of 63:1 achieved.

By way of comparison with the present embodiments, known and possible displays are described further hereinbelow. For such a known or possible display with front surface reflectivity of at least 4% to ambient illuminance and with the same 10000 lux illuminance and 2000 nits luminance, a perceived visual contrast of at most 16:1 is achieved, undesirably degrading image contrast.

Alternatively, to achieve a similar 16:1 contrast ratio in ambient illumination, the luminance of the display 100 of the present embodiments may be significantly reduced in comparison to known displays. Advantageously power consumption may be reduced and contrast maintained.

In typical construction, non-Lambertian (typically clear) front diffusion is used for the display front surface and thus an observer may see more specular images of ambient light sources such that parts of the display may be visible with substantially increased ambient light source reflection, providing undesirable variations of image contrast across the conventional display surface.

As described elsewhere herein, the micro-LEDs 3 and catadioptric optical elements 38 may provide very low levels of stray light for illumination of black state images, as the micro-LEDs are not emitting when current is not applied, and leakage between adjacent micro-LEDs by the catadioptric optical elements is minimised.

The width or diameter of the micro-LEDs may be less than 300 microns, preferably less than 200 microns and more preferably less than 100 microns. In the at least one catadioptric cross-sectional plane the distance between the first and second outer surfaces at the second end of the catadioptric optical element may be less than 3 mm, preferably less than 1.5 mm and more preferably less than 0.75 mm.

In a further illustrative example, a display may be provided at a size of 50", with pixel resolution of 7680×4320 for example, requiring a lateral pixel pitch for apertures 317 of 144 microns. Catadioptric optical elements of pitch 144 microns may be provided in alignment with micro-LEDs with lateral dimension that may for example be 10 microns.

Micro-LEDs 3 may be arranged to provide illumination by means of aligned catadioptric optical elements 38 of apertures 317 with width 15 microns for example. The catadioptric optical elements 38 may have a thickness of approximately 100 microns, such that the total thickness of the display apparatus 100 may be less than 1 mm.

Advantageously an efficient and thin display may be provided with high front of screen contrast, very high output luminance and high efficiency. Further large displays with small pixels pitches below 1*mm* may be readily achieved. Advantageously thin and bright displays give high visual performance in high ambient conditions such as outdoors.

It would further be desirable to provide large area bright displays that are modular and can be scaled to arbitrary display size and aspect ratio at manufacture or on-site assembly.

FIG. 2 is a schematic diagram illustrating in a side view a display apparatus comprising an array of micro-LEDs 3, aligned array of catadioptric optical elements 38, aligned array of optical apertures 317 that are arranged in separated image pixel array relay structure 202A, 202B behind a low reflectivity screen 306.

The display apparatus may comprise at least two image pixel array relay structures 202A, 202B wherein the image pixel array relay structures 202A, 202B are tiled.

FIG. 2 further illustrates that each catadioptric optical element 38 may comprise refractive and reflective surfaces that are shaped to converge the light from sources 3 directly in to the regions 317 without a converging lens surface 310.

Misalignments of the illumination region 320 with the aperture 317 may undesirably cause image non-uniformities. Support members 319 may be provided to align each image pixel array relay structure 202A, 202B in registration with the screen 306.

Each image pixel array relay structure 202A, 202B may be provided with an alignment adjustment structure 382 so as to provide relative motion 384 of the optical output 320 of each image pixel array relay structure 202A, 202B with respect to the apertures 317 of the screen 306.

The micro-LEDs 3 and substrate 47 may be made in regular sections, for example 1 ft×1 ft or "tiles" and aligned in the field to the desired size screen which may be for example 25 ft×11 ft. The tiled image pixel relay systems 202 may each be flexible, or may be formed on a rigid or semi-rigid substrate 304 such as glass.

Multiple screen sizes can conveniently be provided, and screen tiles can be reused for many screen sizes while providing a simple alignment procedure to the screen 306. The image pixel array relay structures 202A, 202B may be provided as standard size units and that custom sized screens can be configured either in a factory or in the field to advantageously provide different screen sizes and aspect ratios. Further for very large displays, component parts can be conveniently shipped and assembled on site. The screen 306 may be provided as a flexible continuous substrate and individual panels aligned to the apertures of the screen. Advantageously dimensional instabilities of the screen 306 may be reduced by providing alignment over small areas of the screen 306 for each image pixel array relay structure 202A, 202B.

During the manufacturing steps described in the embodiments of FIGS. 13A-13D below, the yield of each image pixel array relay structure 202A, 202B may be greater than for the assembly of an equivalent full area display. The gaps or seams between adjacent image pixel array relay structures 202A, 202B are provided between the image pixels of the display and are advantageously not visible as they may be if the image pixel array relay structures 202A, 202B were viewed directly.

It may be desirable to arrange the region 317 of the screen 306 so that the illumination substrate 47 could be aligned to the screen 306 with lower tolerance than the embodiment shown in FIG. 1. It may be desirable to further reduce the tolerance on aligning catadioptric optical elements 38 to screen substrates. It may be further desirable to use more than one micro-LED 3 per pixel so that the luminance of each pixel across the area of the display is not entirely determined by the individual characteristic light output of a single micro-LED. Advantageously image uniformity may be increased.

The mechanical design may be arranged to allow precise alignment without adjustment during display apparatus 100 assembly. Advantageously assembly time and complexity may be reduced.

Alternatively it may be desirable to automate the alignment of the structures 202. During a display assembly step, micro-LEDs 3 may be illuminated and a detector 381 that may be a camera or a human observer for example is arranged to detect the output through each aperture 317 of the screen 306. The alignment of the image pixel array relay structure 202a is thus adjusted to optimise the output and uniformity through apertures 317 of the screen 306, achieving desirable uniformity and efficiency.

Alternatively a reflective layer 391 may be provided between the absorbing regions of light absorbing structure 316 and the catadioptric optical elements 38. A detector 380 may be provided adjacent to at least one micro-LED 3 such that light ray 393 reflected from the screen 306 are detected. The signal on the detector 380 can be minimised to provide feedback of maximum transmission through the aperture 317. Advantageously misalignment non-uniformities can be reduced.

Display controller 332 may be provided with image controller 333 arranged to provide image data to the micro-LED pixels of the display apparatus 100, with image controller 333 providing different image data to each image pixel array relay structure 202. Each image pixel array relay structure 202A, 202B may be provided with an address such as a network address or Ethernet address so that display controller 332 may control information on each tile. Groups of tiles may be addressed from different remote sites over a network, so that one group of tiles monitors a live feed from a remote source.

Acoustic arrangements of the display apparatus will now be described. In large displays, it may be desirable for audio data to be associated with appropriate regions of the display area, such as actor locations. Sound sources such as loudspeakers or acoustic transducers 530A, 530B are provided behind the screen 306 so that the sound appears to emanate from the images of the display. The display further comprises a plurality of holes 534,535 in the screen 306 to transmit sound through the screen 306.

The plurality of acoustic holes 534, 535 may have a profile arranged to reduce light transmission from the image pixel array relay structure and to reduce frontal reflections. The holes may be inclined such as acoustic aperture 534, or may be cranked such as acoustic aperture 535 may have other shapes to prevent light transmission while achieving acoustic transmission over an appropriate audio spectrum.

Advantageously additional space for loudspeakers outside the edges of the screen is not required.

Audio controller 335 provides audio signals to acoustic transducers 530A, 530B. The transducers 530A, 530B may for example be provided on the image pixel array relay structures 202A, 202B respectively and may be arranged on the micro-LED backplane 52. Additionally, or alternatively acoustic transducers 530C, may be provided on the screen 306, may be provided in the gap 322 between the image pixel array relay structure 202 and screen 306 or may independently arranged.

Advantageously the sound appears to come directly from the screen without any unwanted illumination spots produced by the apertures 534.

It may be desirable to relax the alignment tolerances of the micro-LEDs 3 and aligned catadioptric optics 38 to the apertures 317 of the light absorbing structure 316.

FIG. 3 is a schematic diagram illustrating in a side view a display apparatus 100 wherein output light rays 329 from more than one micro-LED 3A, 3B is relayed in to each optical aperture 317 of the light absorbing structure 316. The transparent support substrate 312 further comprises a plurality of lenses 310 arranged between the image pixel array relay structure 202 and the apertures 317.

Each of the plurality of lenses 310 is arranged to receive light from at least two micro-LEDs 3A, 3B of the plurality of micro-LEDs. Micro-LEDs 3 and catadioptric optical elements 38 may be provided with a spacing that has a pitch smaller than the pitch spacing of lenses 310 that may be formed on substrate 312 in alignment with the apertures 317. Lenses 310 may be formed during the fabrication of the screen 306 and may be integrated with the transparent substrate 312. In operation light rays 329A, 329B from micro-LEDs 3A, 3B is captured by each curved surface of lens 310 so that illumination regions 320 from adjacent catadioptric optical elements are overlapped at the aperture 317.

In comparison to the arrangement of FIG. 1, advantageously the thickness of the image pixel array relay structure 202 is reduced for a given image resolution. Further, the illumination of the region 320 may have reduced tolerance of alignment in comparison to the arrangement of FIG. 1. Lateral offsets of the catadioptric optical elements 38 provide reduced lateral shifts of the location of the region 320 as the location is determined by the angular output direction of the catadioptric optical elements rather than their location.

The lenses 310 may be conveniently formed in alignment with the apertures 317. In an exemplary fabrication method, the light absorbing structure 316 may be provided by a photo-sensitive material such as silver halide photographic material. The aperture regions 317 may be formed by illumination through the lenses 310 from the relay structure 302 or equivalent illumination. After silver halide development, the apertures 317 are coincident with the desirable illumination regions 320, and light absorbing regions provided outside the aperture regions 317 in light absorbing layer 318. In the embodiment of FIG. 2 and FIG. 3, the light absorbing structure 316 comprises the light absorbing layer 318. Advantageously a self-aligning array of apertures 317 may be provided at low cost. Alignment cost and complexity may be reduced and image uniformity increased.

In operation, image controller 333 may be arranged to provide micro-LEDs 3A, 3B with the same or different image data. More than one micro-LED 3 may contribute to the light from each pixel of the image and the display is more robust to individual micro-LED 3 failures and to variation in the individual light output characteristics of micro-LEDs 3.

A white state may be achieved by illuminating both of the micro-LEDs 3A, 3B whereas a low grey level output may be achieved by illuminating a smaller number of micro-LEDs per image pixel, in this example being only micro-LED 3A. Advantageously the dynamic range of the display may be increased, providing higher luminance white state and lower luminance black states than can be provided by a single micro-LED per image pixel.

It may further be desirable to increase the reliability and stability of colour control materials of a colour display. Such increased reliability and stability may be achieved by providing colour control materials that are remote to the micro-LED 3.

FIG. 3 further illustrates that colour control materials 491R, 491G, 491B may be formed between the apertures 317 and the image pixel relay system 202 and may be formed on the transparent substrate 312.

Colour control materials 491R, 491G may be wavelength conversion materials to convert blue light from micro-LEDs 3 to red and green light. Material 491B may comprise a blue pass filter to transmit light from blue emitting micro-LEDs 3. White colour conversion material 491W may be omitted from the micro-LEDs 3.

Alternatively, colour control material 491B may comprise wavelength conversion materials, for example if the micro-LEDs 3 provide ultraviolet light and the material 491B may be a blue wavelength conversion material.

Alternatively, the materials 491R, 491G may be colour filters arranged to pass red and green light respectively from white light provided by the micro-LEDs 3.

During operation, heating of the micro-LEDs may degrade the optical conversion efficiency of the wavelength conversion materials such as phosphors or quantum dot materials, or degrade the transmission properties of colour filters. The arrangement of FIG. 3 provides remote colour control materials that have reduced operating temperatures in comparison to the arrangement of FIG. 1. Advantageously the stability, efficiency and lifetime of the colour control materials 491 may be increased.

Alternatively, the micro-LEDs 3 may be provided with a yellow phosphor material and materials 491R, 491G may be red and green filters. Advantageously the colour uniformity of the display may be increased.

Arrangements of colour pixels will be further described hereinbelow.

It may be desirable to increase the resolution of the display screen.

FIG. 4 is a schematic diagram illustrating in a side view a display apparatus 100 wherein light from micro-LED 3 is relayed in to multiple light transmitting apertures of the low reflection screen 306.

In comparison to the arrangement of FIG. 3, multiple lenses 310 are arranged with each catadioptric optical element 38. Advantageously, the thickness of the low reflection screen 306 may be reduced. Further, the alignment tolerance of the catadioptric optical elements 38A, 38B to the apertures 317 may be relaxed, reducing cost and complexity.

Further the separation of apertures 317 is reduced, achieving increased screen resolution. Such higher resolution screen may advantageously reduce visibility of individual apertures, while not increasing total image resolution. Further, dust or other debris may cover some of the apertures 317, however some light from a given micro-LED 3 is imaged through other of the apertures 317. Advantageously display ruggedness may be increased.

The structure of the screen 306 will now be further described.

Figure 5:
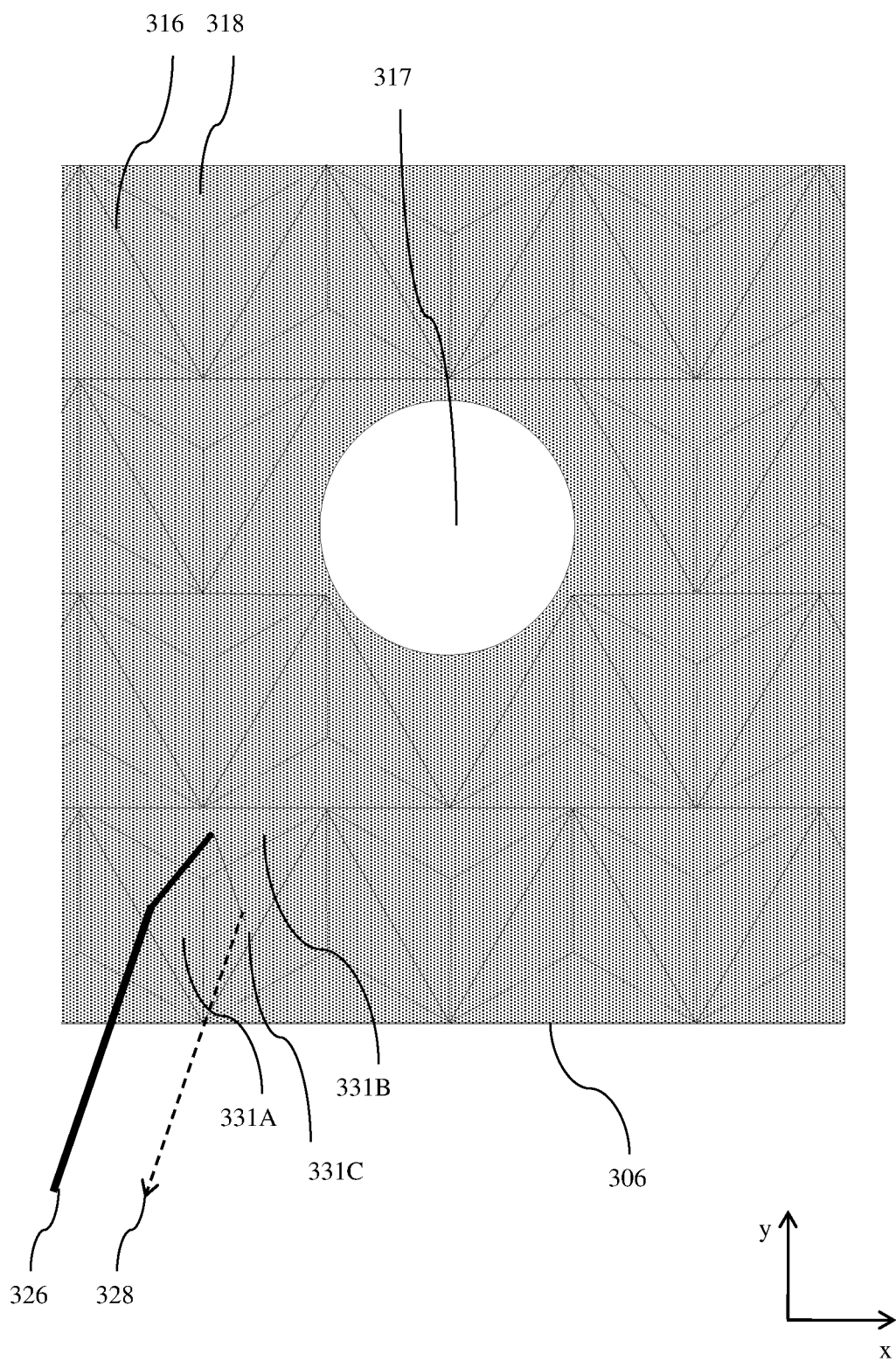
FIG. 5 is a schematic diagram illustrating in front view a low reflection screen including an aperture for sound and/or light and a plurality of corner cube absorbers.

FIG. 5 further illustrates in front view a light absorbing structure 316 that comprises a corner cube retro-absorber microstructure, of a section of the low reflection screen 306 comprising a light absorbing layer 318.

Light absorbing structure 316 has a dark or black surface that may be physically shaped such as a plurality of corner cube absorbers each comprising facet surface 331A, 331B, 331C. In operation ambient light rays 326 are incident on the facet surfaces 331A, 331B, 331C of the corner cube absorber. At each surface reflection, light is absorbed and scattered such that the overall luminance of light rays 328 is substantially reduced in comparison to a planar black surface.

The light absorbing structure 316 may comprise a surface relief comb structure with high surface area for absorption of incident radiation. The light absorbing structure 316 may alternatively or additionally comprise a nanostructured black absorber, a "nanoblack" or other similar material such as that marketed by Acktar, (Kiryat-Gat, Israel).

Advantageously front of screen reflections are reduced and image contrast enhanced or power consumption reduced for a desirable achieved contrast ratio. Further, known micro-structured surface tooling and replication methods can be provided to form the structure of the corner cubes or other micro-structured surface to achieve low cost and high uniformity.

The feature size of the micro-structure may be less than the pitch of the aperture 317. For example, the pitch of the apertures 317 may be 300 micrometres and the microstructure may have a pitch of 100 micrometres. The features of the micro-structure may be arranged to minimise diffractive spreading of reflected light rays 328, for example by minimising the number of narrow features of less than 20 micrometres size at the cusps of the microstructure.

Light from micro-LEDs 3 (not shown) exits to the observers through regions 317 which may be apertures or a translucent diffuser in the light absorbing structure 316. Advantageously a very high contrast display is produced which is not affected by high levels of ambient lighting.

The light absorbing structure 316 may be used indoors, where the black material and shape of light absorbing structure 316 help attenuate reflections from light reflected off the faces and clothing of the one or many observers, which would otherwise reduce the perceived contrast of the displayed images, for example when the ambient illumination is absent or very low. The light absorbing structure 316 may further be coated with Teflon or other similar material which resists staining or wetting and is resistant to degradation by dust and/or liquids.

The regions 320 may be formed by embossing, UV casting or other known techniques, in the surface of substrate 312 with a surface relief diffuser pattern and may cover just the region adjacent an optical aperture 317 of the low reflection screen 306. Alternatively, the entire front surface of substrate 312 may be a formed as a diffuser or may have a diffuser film (not shown) attached to the front of substrate 312 as a separate layer.

Further arrangements of colour pixels will now be described.

Figure 6:
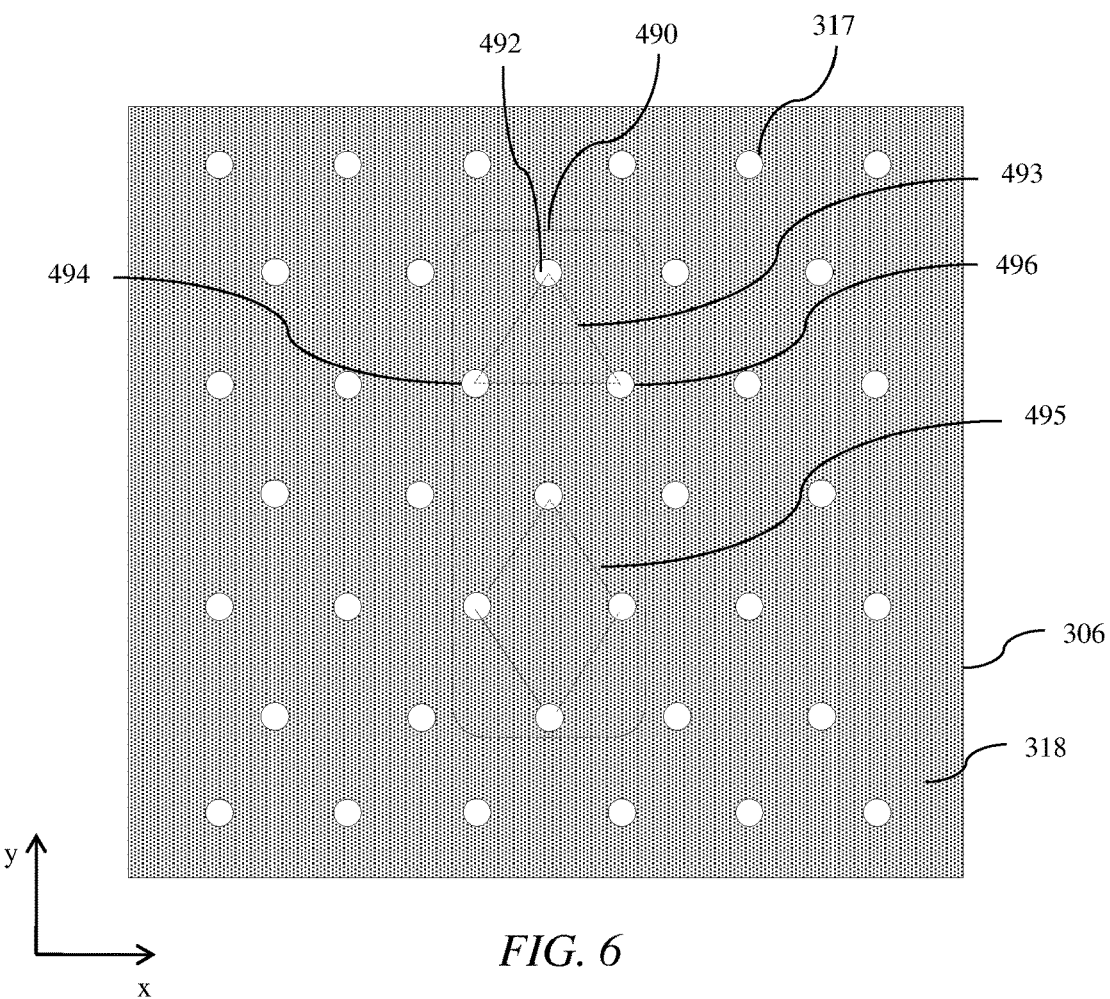
FIG. 6 is a schematic diagram illustrating in a front view a low reflectivity screen illustrating an arrangement of coloured light apertures to provide image pixels.

FIG. 6 is a schematic diagram illustrating in a front view a low reflectivity screen 306 illustrating an arrangement of coloured light apertures 317 to provide colour image pixels. Colour control materials 491R, 491G, 491B may arranged with the micro-LEDs or at the apertures 317 as illustrated in FIG. 3 for example. The wavelength converting materials may be phosphors or quantum dot materials.

Coloured sub pixels 492, 494, 496 may be provided by patterning of colour control materials disposed on the screen in the regions 317 as described above in FIG. 3. In operation, light from micro-LEDs may be arranged to illuminate regions 320 in alignment with apertures 317. In some apertures 317, no colour control material may be provided, for example if a blue pixel is provided by a blue emitting micro-LED 3 or a red pixel by a red emitting micro-LED 3. In other apertures, red wavelength conversion material or green wavelength conversion material may be provided.

Colour image pixel 490 may comprise one or more sub pixels groups 493, 495. Advantageously redundancy is provided if some apertures 317 associated with sub pixels 492,494 etc become blocked. Colour pixel 490 may comprise sub pixels 492, 494, 496 arranged in triad 493 which may for example be red green and blue sub pixels. The colour pixels may be arranged as stripes, diamonds or in other configurations. The plurality of micro-LEDs 3 may provide blue light and at least one wavelength conversion layer 491 (not shown) is arranged to convert blue light into yellow or green or red light.

Further the pixel 490 may be comprised of more than one set of pixels groups 493, 495 in order to advantageously achieve extended colour gamut, for example by providing yellow or cyan colour conversion materials, or by adding additional green pixels to increase spatial resolution.

For example, the pixel 490 may comprise sub pixels to provide the DCI P3 colour space. Advantageously the colour control materials 491R, 491G may have increased durability and colour conversion efficiency in comparison to materials for direct conversion from blue light from the plurality of micro-LEDs 3.

Alternatively, or additionally, the plurality of micro-LEDs 3 may provide white light, for example for providing high durability colour control materials 491 at the micro-LEDs. Red, green or blue light transmitting colour filters and may be provided respectively in different light transmitting aperture regions 317.

Advantageously a colour display may be provided with high colour gamut and fidelity.

The alignment of catadioptric optical elements 38 with the micro-LED backplane 52 will now be further described.

Figure 7:
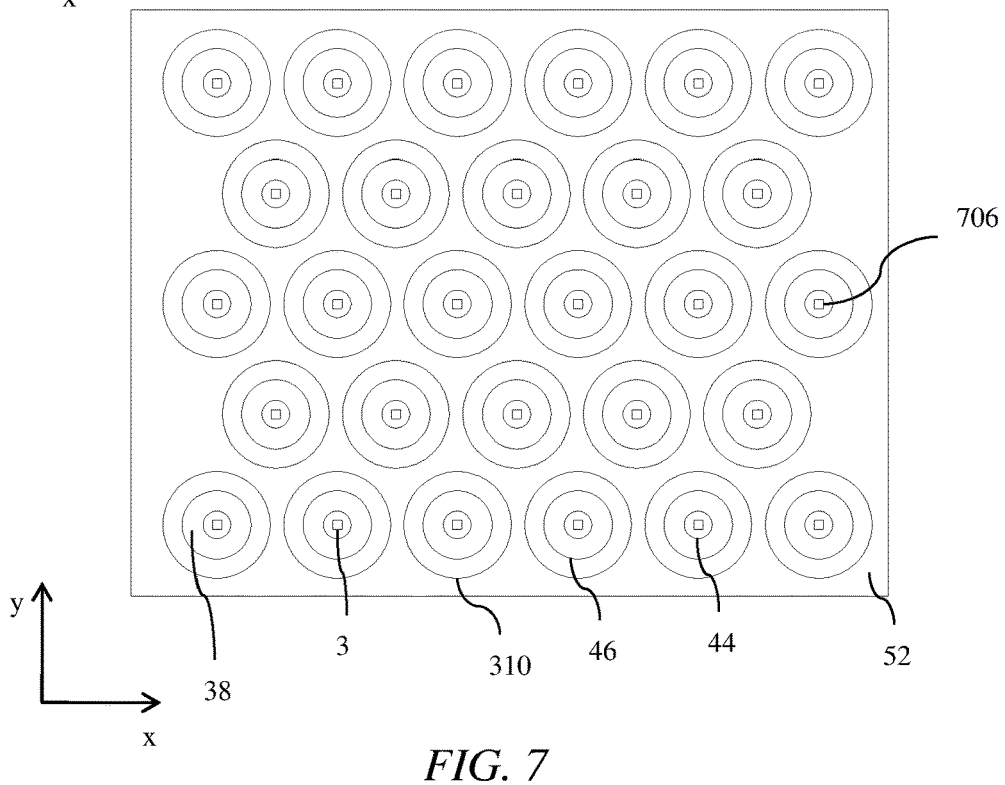
FIG. 7 is a schematic diagram illustrating in front view an array of catadioptric optical elements aligned to an array of micro-LEDs to provide a colour display.

FIG. 7 is a schematic diagram illustrating in front view a plurality of catadioptric optical elements 38 aligned to a plurality of micro-LEDs 3 to provide illumination regions 320; and illustrates respective locations of the outer part of surfaces of the image pixel array relay structure 202. The structure of exemplary catadioptric optical elements 38 will be further described with reference to FIG. 12D below.

The micro-LEDs 3 may be aligned with the inner wall surface 42 and output of the side reflective surface 46 of the catadioptric optical element 38. The converging lens 310 may be larger than the output width of the catadioptric optical element to efficiently collect light and reduce cross talk. In stripe colour pixel configurations, the aligned optical elements 3, 38, 310 may be arranged as stripes.

Advantageously the output light from the micro-LEDs 3 is directed towards apertures 317 of the screen 306 while achieving desirable colour pixel arrangements.

Figure 8:
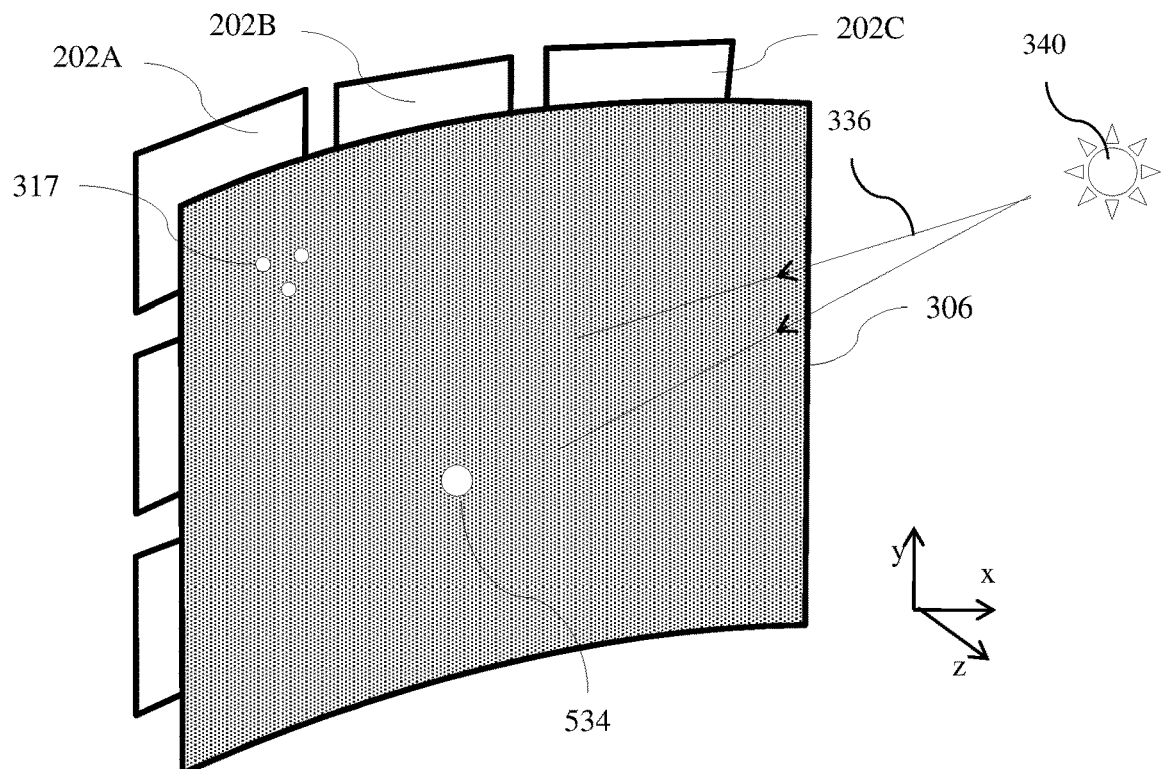
FIG. 8 is a schematic diagram illustrating in perspective view a display apparatus comprising a tiled array of image pixel relay systems and a curved low reflectivity screen.

FIG. 8 is a schematic diagram illustrating in perspective view a display apparatus comprising a tiled array of image pixel relay systems 202 and a curved low reflectivity screen 306. The screen 306 may be curved or have other deformable shaped surface profile.

The display apparatus comprises at least two image pixel array relay structures 202 wherein the image pixel array relay structures are tiled and the low reflection screen structure 306 is aligned to the at least two image pixel array relay structures 202A, 202B.

The catadioptric optical elements 38 may be arranged to provide illumination regions 320 from the plurality of micro-LEDs 3 that are relayed to an aperture plane 327 that is curved, for example by curving the image pixel relay system 202, or by adjusting the shape of the catadioptric optical elements 38 or focal length and location of lenses 310. The curvature may be about a single axis or multiple axes. Advantageously free form display surfaces may be provided without visibility of seams between the tiled image pixel relay systems 202.

It may be desirable to increase the area of a display beyond that which can be conveniently achieved with a single light absorbing structure 316.

Figure 9:
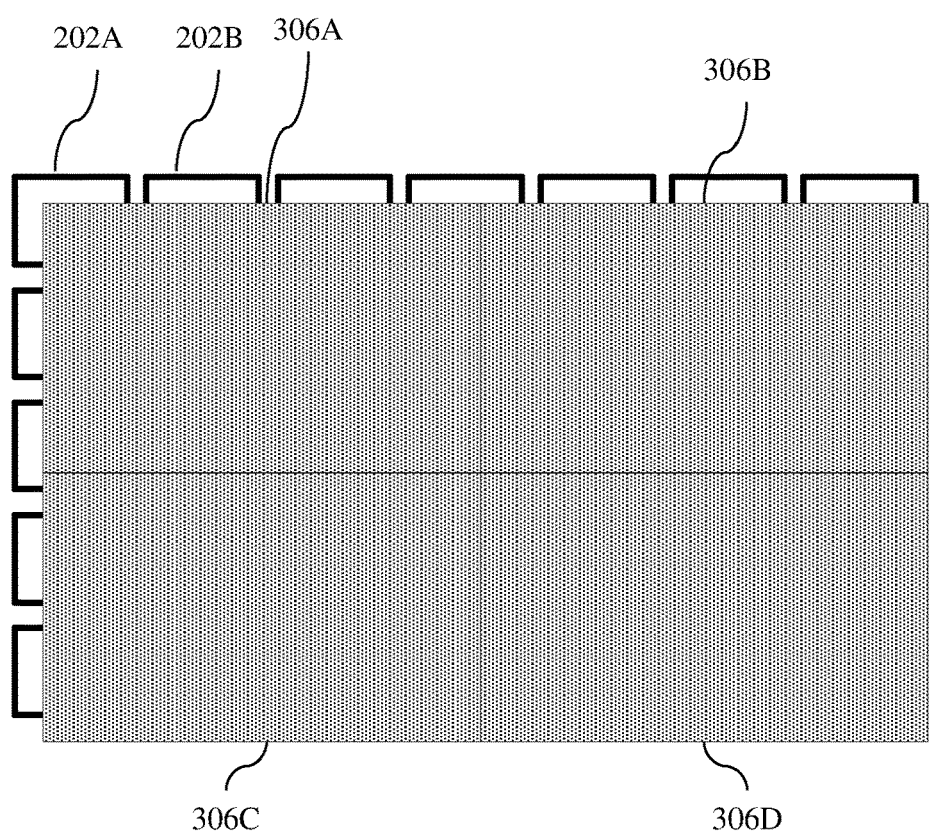
FIG. 9 is a schematic diagram illustrating in front view a tiled display apparatus comprising tiled low reflection screens.

FIG. 9 is a schematic diagram illustrating in front view a composite display apparatus comprising tiled low reflection screens 306A, 306B, 306C, 306D. Multiple screens 306 may be tiled, each comprising one or more tiles of image pixel array relay structures 202.

A composite display apparatus may thus comprise at least two display apparatuses provided in a tiled arrangement. Each display apparatus may comprise: at least one image pixel array relay structure 202 comprising: a plurality of micro-LEDs 3, the plurality of micro-LEDs 3 being arranged in a micro-LED array; a control system 332, 333 arranged to provide the plurality of micro-LEDs with image data; a plurality of catadioptric optical elements 38 arranged in a catadioptric optical element array, wherein each of the catadioptric optical elements 38 of the plurality of catadioptric optical elements is aligned in correspondence with a respective one or more of the micro-LEDs 3 of the plurality of micro-LEDs, each of the micro-LEDs 3 of the plurality of micro-LEDs being aligned with only a respective one of the catadioptric optical elements 38 of the plurality of catadioptric optical elements; the alignment being such that some of the light output rays 329 from each of the micro-LEDs 3 exits its respective catadioptric optical element 38 with a first light output distribution 320, 320b at an aperture plane 327; a low reflection screen 306 comprising: a transparent support substrate 312 arranged to receive light rays 329 from the image pixel array relay structure 202; a light absorbing structure 316 arranged on the opposite side of the transparent support substrate 312 to the image pixel array relay structure 202 and comprising a plurality of light transmitting apertures 317 arranged in an aperture array; and at least one alignment structure 382A, 382B arranged to align the first light output distribution 320A, 320B at the aperture plane 327 with the plurality of light transmitting apertures 317 of the low reflection screen 306.

Advantageously very large display areas may be provided. Components may be shipped separately and assembled on site for example.

By way of comparison with the present embodiments, known and possible LED displays will now be described.

Figure 10:
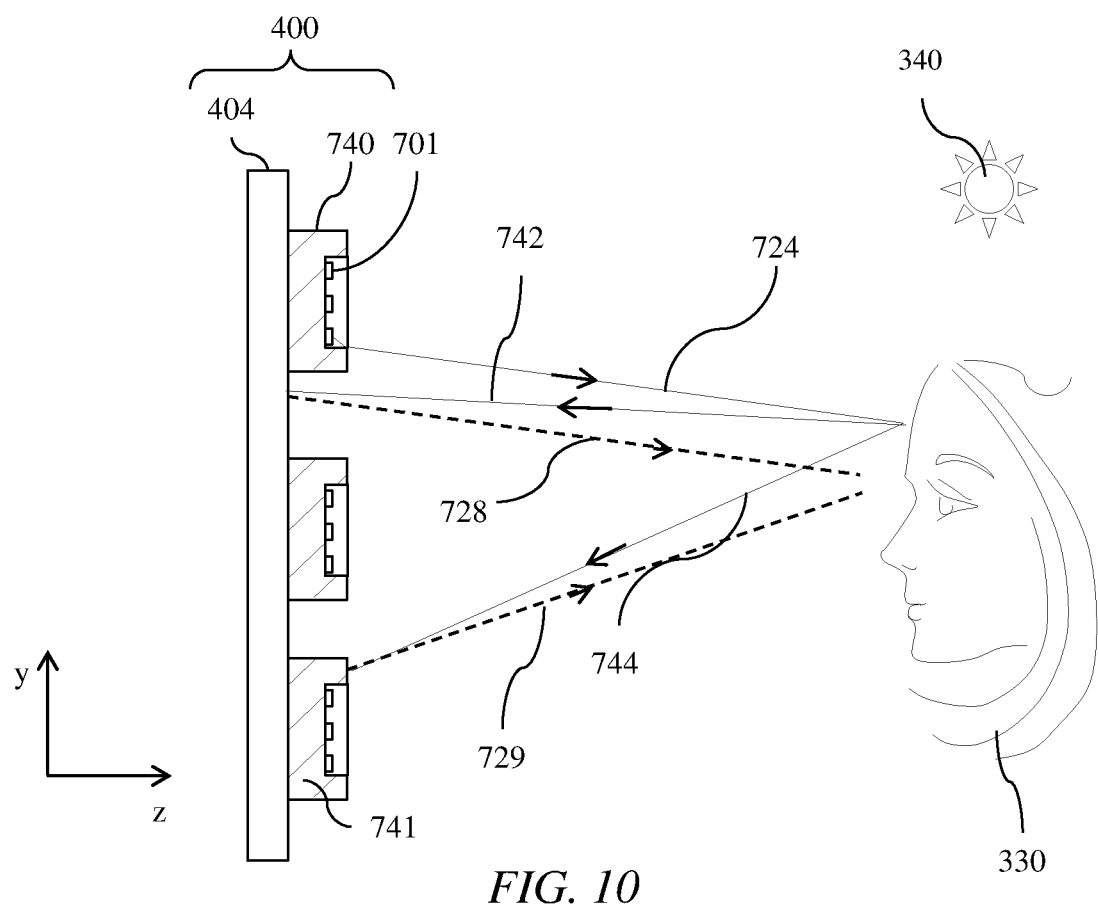
FIG. 10 is a schematic diagram illustrating in side view a known LED display comprising black macroscopic packages.

FIG. 10 is a schematic diagram illustrating in side view a known macroscopic LED display 400 comprising black macroscopic LED packages 740. Macroscopic LED chips 701, such as red, green and blue light emitting colour LEDs are arranged in a single lead-frame package 740 and multiple packages are comprised on substrate 404 that is typically a printed circuit board.

The macroscopic LED packages 740 are typically 2-4 mm long and the individual emitting LED chips 701 may have size of 0.3 mm or greater. In comparison to the array transfer approach of the micro-LEDs of the present embodiments, and described in the present embodiments above, the LED packages 740 are arranged on substrate 404 by means of known pick and place techniques. Such techniques are time consuming and expensive for LED displays with large numbers of packages 740.

Macroscopic LED displays 400 for outdoor use may be constructed of LED chips embedded in a black plastic resin material 741 surround in order to reduce ambient light reflections and increase the overall contrast and viewing quality of the display. The black resin material 741 absorbs incident emitted light rays 724, which undesirably reduces the efficiency of the package and increases overall power consumption and heating of the display. The emitted light loss attributable to black packages can exceed 50%.

Light rays 724 from the macroscopic LED package 740 may reach the face of an observer 730. Light rays 742 reflect from the face or clothing of observer 330 back towards the substrate 404 as shown by example ray 742. When reaching the substrate 404 the ray 742 may be reflected or scattered back towards the same or another observer 330 as ray 728. Similarly an example ray 744 may be reflected from an observer 330 back to the package 740 from where it is reflected or diffused back towards an observer 330 shown by example light ray 729. Rays 728 and 729 reduce the perceived contrast of the display. The contrast of the display is reduced by back reflection of its own emitted light. This is particularly noticeable in dark rooms. In lighted rooms, similar paths to rays 728 and 729 exist for the reflection of general ambient light from the display surface. Such reflected ambient light reduces the contrast of the display.

Figure 11A:
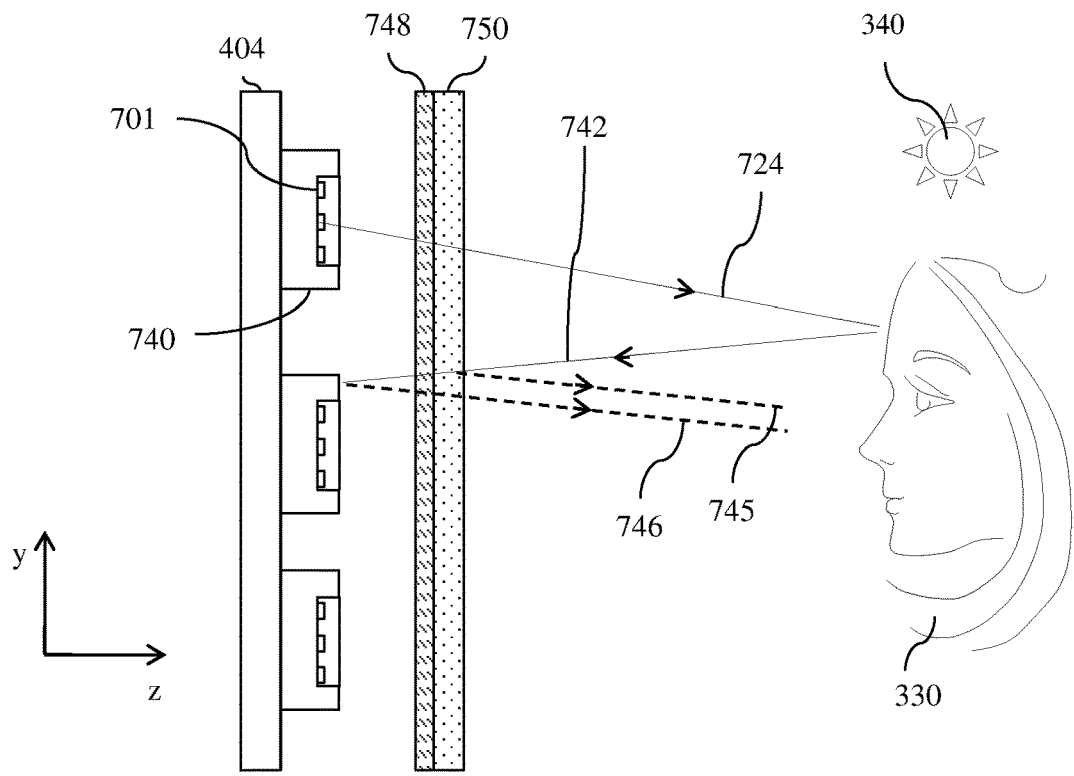
FIG. 11A is a schematic diagram illustrating in side view a possible LED display comprising white packages and a quarter waveplate and polariser layer to reduce frontal reflections.

FIG. 11A is a schematic diagram illustrating in side view part of a possible LED display by way of comparison with the present embodiments comprising white macroscopic LED packages 740, quarter waveplate 748 and polariser layer 750 to reduce frontal reflections. Light rays 742 that are reflected from the observer 330, from ambient environment and/or are provided by ambient light sources 340 are incident onto the polariser 750.

Disadvantageously the LEDs 701 typically output unpolarised light so that the polariser 750 reduces output efficiency.

In operation in ambient illumination, some light rays 745 are reflected from the front of the polariser layer 750. Transmitted ray 742 is polarised by polariser 750 and circular polarisation is incident onto packages 740 and LED backplane 404. The parts of the backplane 404 that are metallic will reflect illumination with a flipped polarisation state that is absorbed by polariser 70 after transmission through quarter waveplate 748. However, light rays 746 that are reflected by package 740 are depolarised, so that some light is passed by the polariser 750. Disadvantageously contrast ratio is reduced. Power consumption to achieve a desirable contrast ratio is further increased in ambient illumination environments. In environments in which ambient illumination is provided by the illumination from the display itself, it is not possible to increase contrast ratio.

Figure 11B:
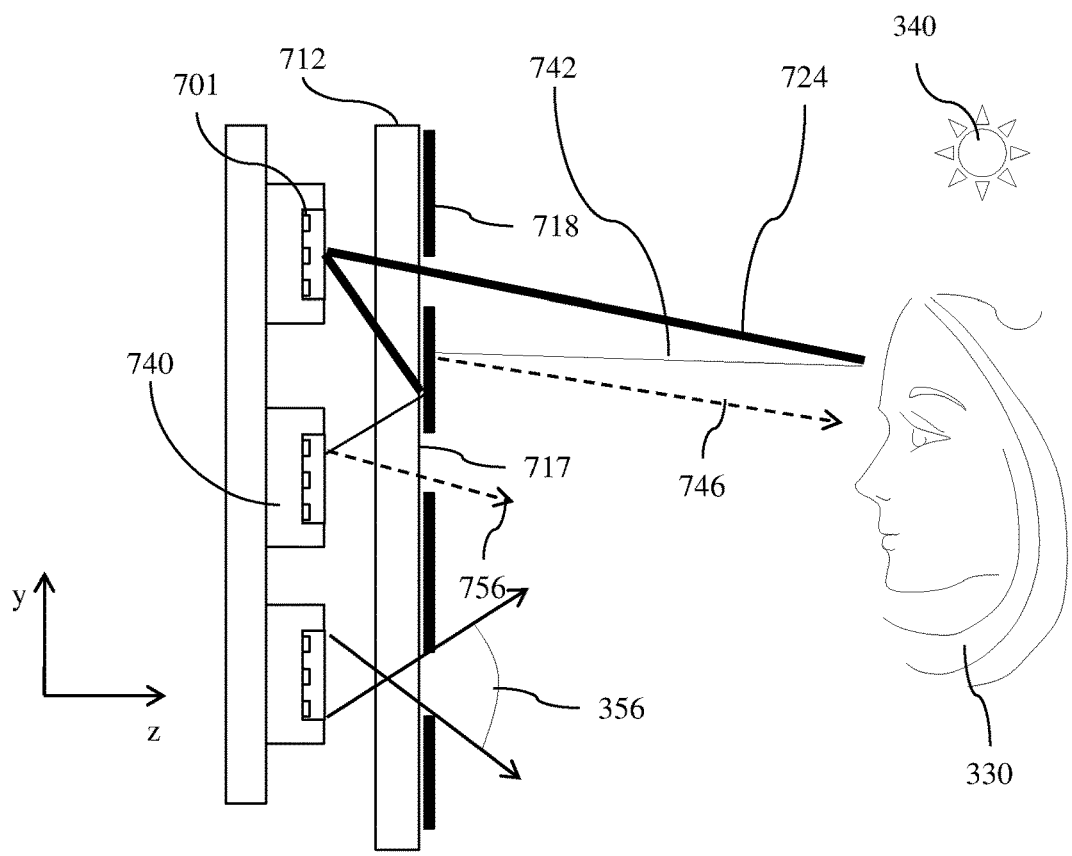
FIG. 11B is a schematic diagram illustrating in side view a part of a possible LED display comprising a black front screen material with apertures for passing light.

In comparison to the arrangements of FIGS. 11A-11B advantageously the present embodiments reduce the reflection of ambient light and reduce the amount of light reflected back from the viewing environment with high efficiency.

FIG. 11B is a schematic diagram illustrating in side view part of a possible LED display by way of comparison with the present embodiments that is arranged with apertures 717 in a black front screen layer 718. Flat black-painted front layer 718 is mounted on a transparent substrate 712. Apertures 717 are arranged to allow light from sources 701 to reach observer 330. Light path 724 from the sources 701 reflects from observer 330 as illustrated by example ray 742. and is attenuated by front layer 718. Weaker light ray 746 is reflected back to observer 330 from the surface of layer 718, reducing contrast.

Cone angle 356 illustrates the range of angles illuminated from the display and is limited by the size of aperture 717. Disadvantageously much of the light emitted from packages 740 is incident on the rear of layer 718 and does not exit the display. If the proportion of regions 717 is increased relative to the black regions of front layer 718 then the contrast improvement by absorption of ambient light is reduced. Further some light rays 756 may reflect from the layer 718 rather than being transmitted be aperture 717 and may be incident on adjacent LEDs. Disadvantageously such light rays 756 degrade image contrast.

The operation of the catadioptric optical elements 38 of FIG. 1 will now be further described with reference to FIGS. 12A-12G. The shapes of the catadioptric elements in the present embodiments are illustrated by way of example and not of limitation.

Figure 12A:
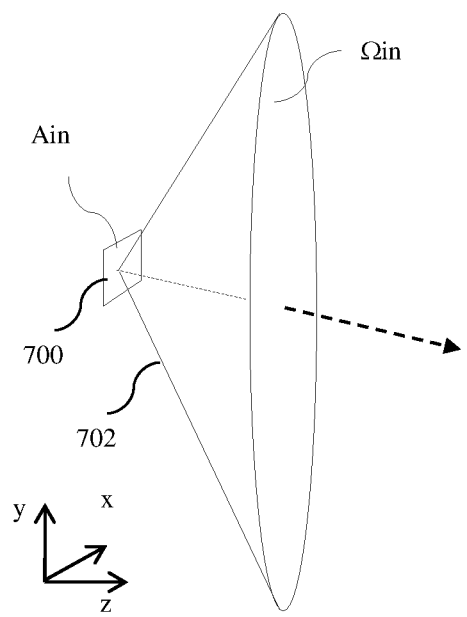
FIG. 12A is a schematic diagram illustrating in perspective view a light source with first area and first solid angle of light cone for input into an optical system.
Figure 12B:
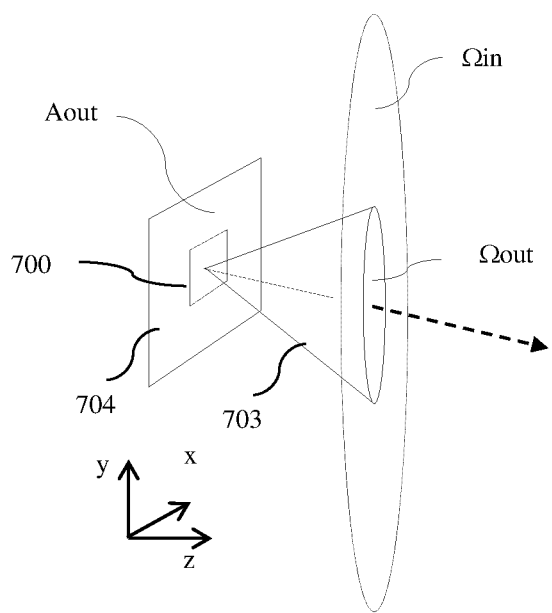
FIG. 12B is a schematic diagram illustrating in perspective view the area and solid angles for output light after light from the light source of FIG. 12A has been directed by the optical system.

FIG. 12A is a schematic diagram illustrating in perspective view a light source 700 with first area Ain and first solid angle Ωin of light cone 702 for input into an unspecified optical system (not shown); and FIG. 12B is a schematic diagram illustrating in perspective view the output surface 704 of area Aout and cone 703 of solid angle Ωout for output light after light rays from the light source of FIG. 12A has been directed by the optical system. Conservation of brightness, or étendue, means that $$A\text{out} * \Omega\text{out} <= A\text{in} * \Omega\text{in} \qquad \text{eqn. 1}$$

Figure 12C:
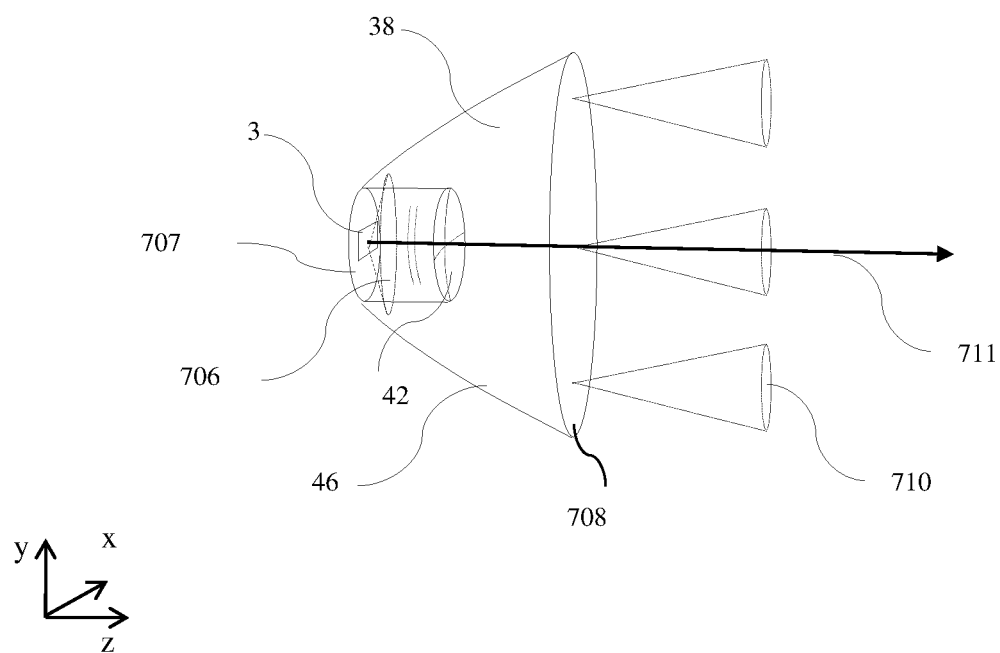
FIG. 12C is a schematic diagram illustrating in perspective view, micro-LED area and solid angle and catadioptric optical element output area and solid angle.

FIG. 12C is a schematic diagram illustrating in perspective view a catadioptric optical element 38 with at a first end 707 a micro-LED 3 with an input area Ain and input solid angle Ωin in cone 706. Second end 708 of the catadioptric optical element 38 has area Aout and transmitted light cone 710 has solid angle Ωout. Equation 1 teaches that Aout is thus greater than Ain, thus in at least one dimension the output width of the catadioptric optical element is greater than the input width to provide the reduction in cone solid angle Ωout. Thus, the smaller solid angle of cone 710 is achieved by increasing the output area Aout of second end 708 in comparison to the area of the micro-LED 3. The catadioptric optical element may be extended; then the width of the micro-LED 3 may be less than the width of the second end 708.

FIG. 12C further illustrates the optical axis 711 of a rotationally symmetric catadioptric optical element 38. In this embodiment, the optical axis 711 is a line along which there is rotational symmetry and is a line passing through centres of curvature of the curved refractive surface 42 and outer reflective surface 46 of the catadioptric optical element 38.

In embodiments in which the catadioptric optical element 38 is arranged to operate on-axis, the output luminance may be arranged to be provided in a direction normal to the output surface, for example normal to the transparent support substrate 47. In such embodiments, the optical axis 711 may be the axis of reflective symmetry of the refractive surface 42 and outer reflective surface.

The arrangement and operation of catadioptric optical elements 38 will now be further described.

Figure 12D:
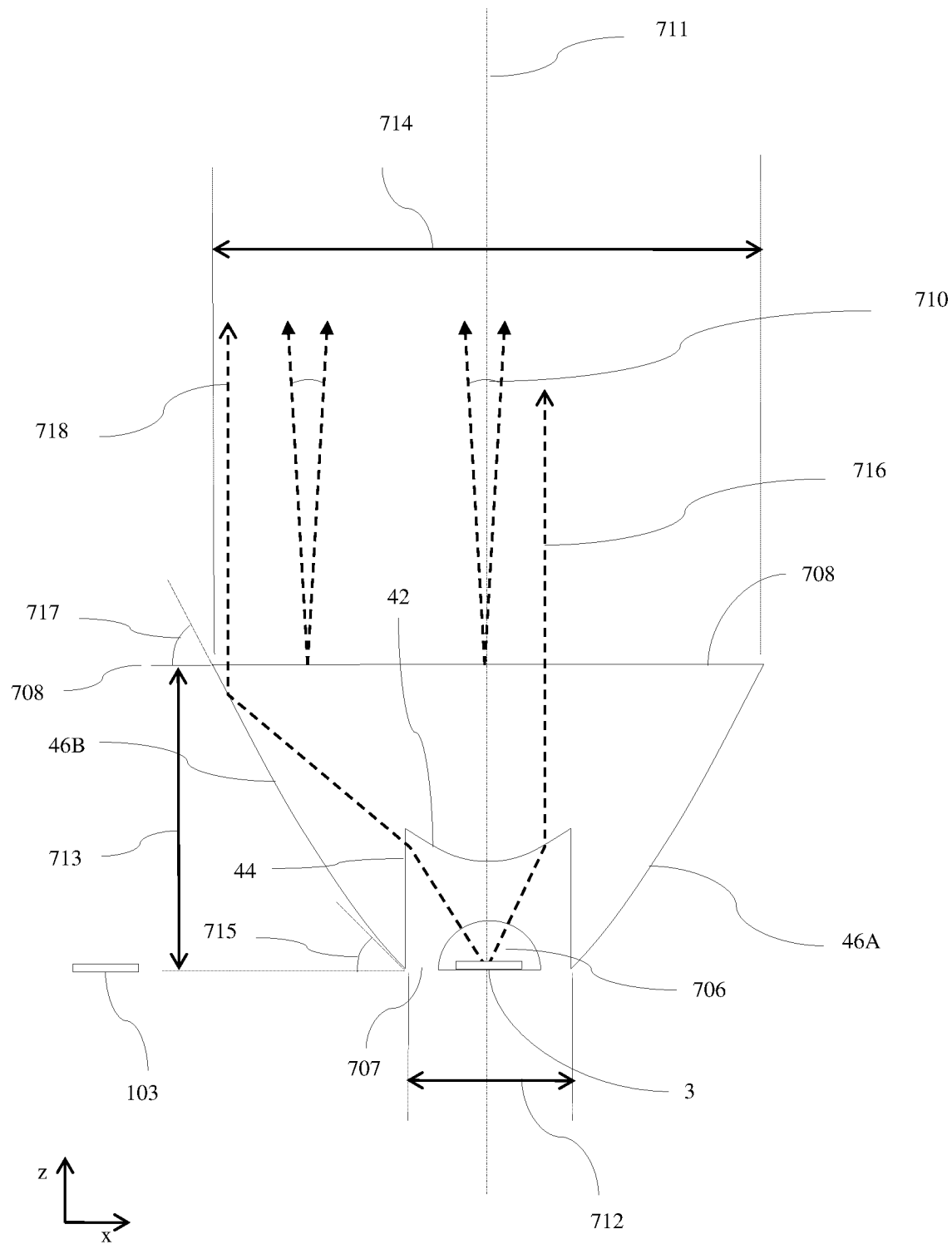
FIG. 12D is a schematic diagram illustrating in side view the input width and output width of a catadioptric optical element in at least one cross sectional plane.

FIG. 12D is a schematic diagram illustrating in side view the input width 712 and output width 714 of a catadioptric optical element 38 in at least one cross sectional plane through its optical axis 711. Thus, the cross sectional plane is the x-z plane and the optical axis 711 is in the cross sectional plane.

Each of the catadioptric optical elements 38 of the plurality of catadioptric optical elements comprises, in at least one cross-sectional plane through its optical axis 711 a first outer surface 46a and a second outer surface 46b facing the first outer surface 46a. The first and second outer surfaces 46A, 46B extend from a first end 707 of the catadioptric optical element 38 to a second end 708 of the catadioptric optical element 38, the second end 708 of the catadioptric optical element 708 facing the first end 707 of the catadioptric element.

The distance 712 between the first and second outer surfaces 46A, 46B at the first end of the catadioptric optical element is less than the distance 714 between the first and second outer surfaces 46A, 46B at the second end 708 of the catadioptric optical element 38. At least one transparent inner surface 42, 44 is arranged between the first and second ends 707, 708 and between the first and second outer surfaces 46A. 46B.

End 708 may be provided by an output surface of the catadioptric optical element 38, or may be for example arranged in a layer of a moulded optical component, for example on transparent support substrate 47 of FIG. 1.

Each of the catadioptric optical elements 38 of the plurality of catadioptric optical elements is aligned in correspondence with a respective one or more of the micro-LEDs 3 of the plurality of micro-LEDs, each of the micro-LEDs of the plurality of micro-LEDs being aligned with only a respective one of the catadioptric optical elements of the plurality of catadioptric optical elements. The alignment in correspondence between a catadioptric optical element 38 of the plurality of catadioptric elements and its respective one or more of the micro-LEDs 3 of the plurality of micro-LEDs is by being positioned at the first end 707 of the catadioptric optical element 38 and aligned with the catadioptric optical element 38.

The micro-LEDs 3 may be positioned between the first end 707 of the catadioptric optical element 38 and the at least one transparent inner surface 42, 44 of the catadioptric optical element 38 and aligned with the catadioptric optical element. For example, in the cross sectional plane the centre of the micro-LED 3 may be aligned with the optical axis 711 of the catadioptric optical element. In the present disclosure the terminology "at the first end of" the catadioptric optical element includes, for example, the micro-LED being a small amount under the first end 707, in the same plane as the end 707 of the catadioptric optical element 38, or in the vicinity of the end 707, or in the proximity of the end 707 or adjacent the end. In each case this may include aligned with the optical axis of the catadioptric optical element. The above description can be applied to all the embodiments.

A catadioptric optical system uses both reflection and refraction of light. Further, a catadioptric optical system is one where refraction and reflection are combined in an optical system, usually via lenses (dioptrics) and curved mirrors (catoptrics). Catadioptric optical elements are sometimes referred to as RXI optical elements. An RXI optical element produces ray deflections by refraction (R), reflection from metals (X), and total internal reflection (I).

The first and second outer surfaces 46A, 46B each comprise curved surfaces that extend from a first end 707 of the catadioptric optical element to the second end 708 of the catadioptric optical element 38, the second end 708 of the catadioptric optical element facing the first end 707 of the catadioptric optical element 38. Further the transparent inner surface 42, 44 comprises at least one curved surface 42. The exterior angle 715 between the first end 707 and the first outer surface 46a at the first end 707 may be less than the exterior angle 717 between the first end 707 and the first outer surface 46a at the second end 708. Further the exterior angle between the first end 707 and the second outer surface 46b at the first end 707 is less than the exterior angle between the first end 707 and the second outer surface 46b at the second end 708.

The cross-section from one side to the other side of the micro-LED 3 is aligned within the first end of the catadioptric optical element 38. In the at least one catadioptric cross-sectional plane, the exterior angle 715 between the first end 707 and the first and second outer surfaces 46A, 46B at the first end 707 is less than the exterior angle 717 between the first end 707 and the first and second outer surface 46A, 46B at the second end 708. In the at least one catadioptric cross-sectional plane at least one of the transparent inner surfaces 42 has positive optical power. in the at least one catadioptric cross-sectional plane at least one of the transparent inner surfaces 44 has zero optical power. In the at least one catadioptric cross-sectional plane some of the light output of micro-LEDs 3 of the plurality of micro-LEDs is transmitted by the at least one transparent inner surface 44 before it is reflected at the first or second outer surfaces 46A, 46B and directed into the first directional light output distribution 320; and some of the light output of the micro-LEDs 3 of the plurality of micro-LEDs is transmitted by the at least one transparent inner surface 42 and directed into the first directional light output distribution 320 without reflection at the first or second outer surfaces 46A. 46B.

Advantageously high efficiency coupling of light from a large solid angle from the micro-LED 3 may be transferred to the illumination region 320.

The cross-section from one side to the other side of the micro-LED 3 is aligned within the first end 707 of the catadioptric optical element 38. A refractive optical element 706 may be further provided between the micro-LEDs 3 of the plurality of micro-LEDs and the at least one transparent inner surface 42, 44. The refractive optical element is a hemispherical lens. The material of the refractive optical element 706 may provide for increased light output efficiency from the high refractive index of the material of the micro-LED 3 and advantageously achieve increased output light coupling efficiency.

The catadioptric optical element 38 may be arranged to provide substantially collimated output light from the micro-LED 3 for light that is incident on the curved outer surfaces 46A, 46B and the at least one the transparent inner surface 44 which may have positive optical power. Further at least one of the transparent inner surfaces 44 may have zero optical power. Advantageously surfaces 44 may be conveniently provided during tooling and moulding steps of manufacture. Further, such surfaces may cooperate to provide collimated light for all light rays from micro-LED 3 over a high output solid angle, as will be described below with reference to FIG. 12G in comparison to FIGS. 12E and 12F.

FIG. 12D further illustrates that a refractive optical element 706 may be provided between the micro-LEDs 3 of the plurality of micro-LEDs and the at least one transparent inner surface 42, 44. The refractive optical element 706 may a hemispherical lens that is arranged to achieve increased efficiency of light output coupling from the high index materials that are typically used for inorganic micro-LEDs 3. The hemispherical lens 706 increases the effective area Ain of the source comprising the micro-LED and hemispherical lens 706, so the light from the micro-LED 3 is distributed over a larger cone angle than would be provided by the micro-LED 3 alone. Advantageously, higher efficiency output coupling may be provided.

In at least one cross sectional plane, the present embodiments provide a reduction in the width of the output directional light output distribution to provide directionality with a directional light output distribution (as described by solid angle Ωout) that is smaller than the input directional light output distribution (as described by solid angle Ωin) by the catadioptric optical element.

The control of output illumination by refractive optics, reflective optics and catadioptric optics will now be described.

Figure 12E:
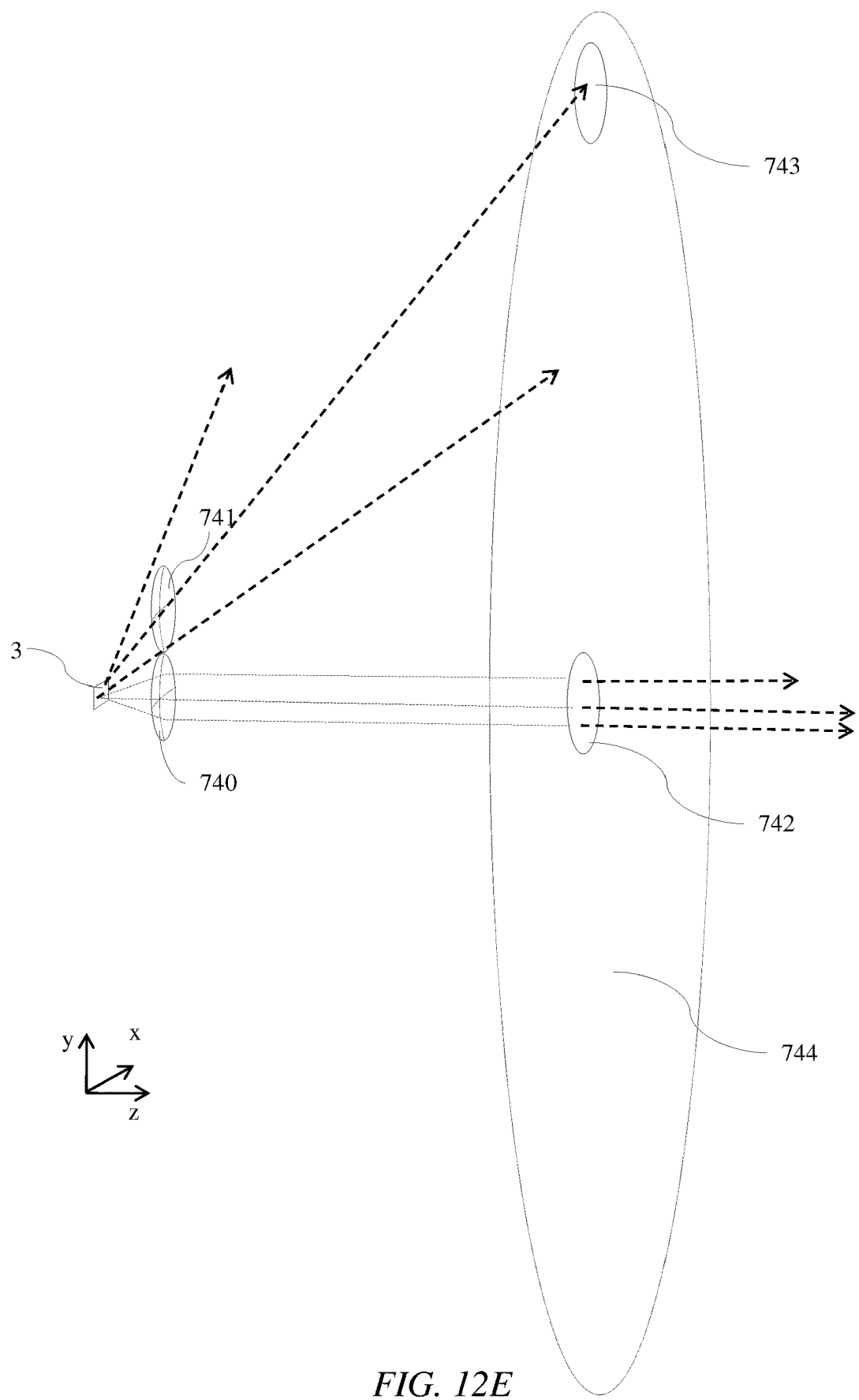
FIG. 12E is a schematic diagram illustrating in perspective view, illumination by a refractive optical element providing a background glow and a central spot beam.

FIG. 12E is a schematic diagram illustrating in perspective view illumination by a plurality of refractive optical elements 740, 741 providing a background glow 744 and central spot beams, 742, 743. Background glow 744 may be provided by light that propagates outside the refractive optical elements 740, and may have a directional light output distribution that is similar to the input light source that may be for example a micro-LED 3.

By way of comparison with the present embodiments, if the refractive elements of FIG. 12E were used in place of the catadioptric optical elements of the present disclosure, then undesirable cross talk and stray light would degrade image contrast in the image provided by means of illumination regions 320 to observer 330.

Figure 12F:
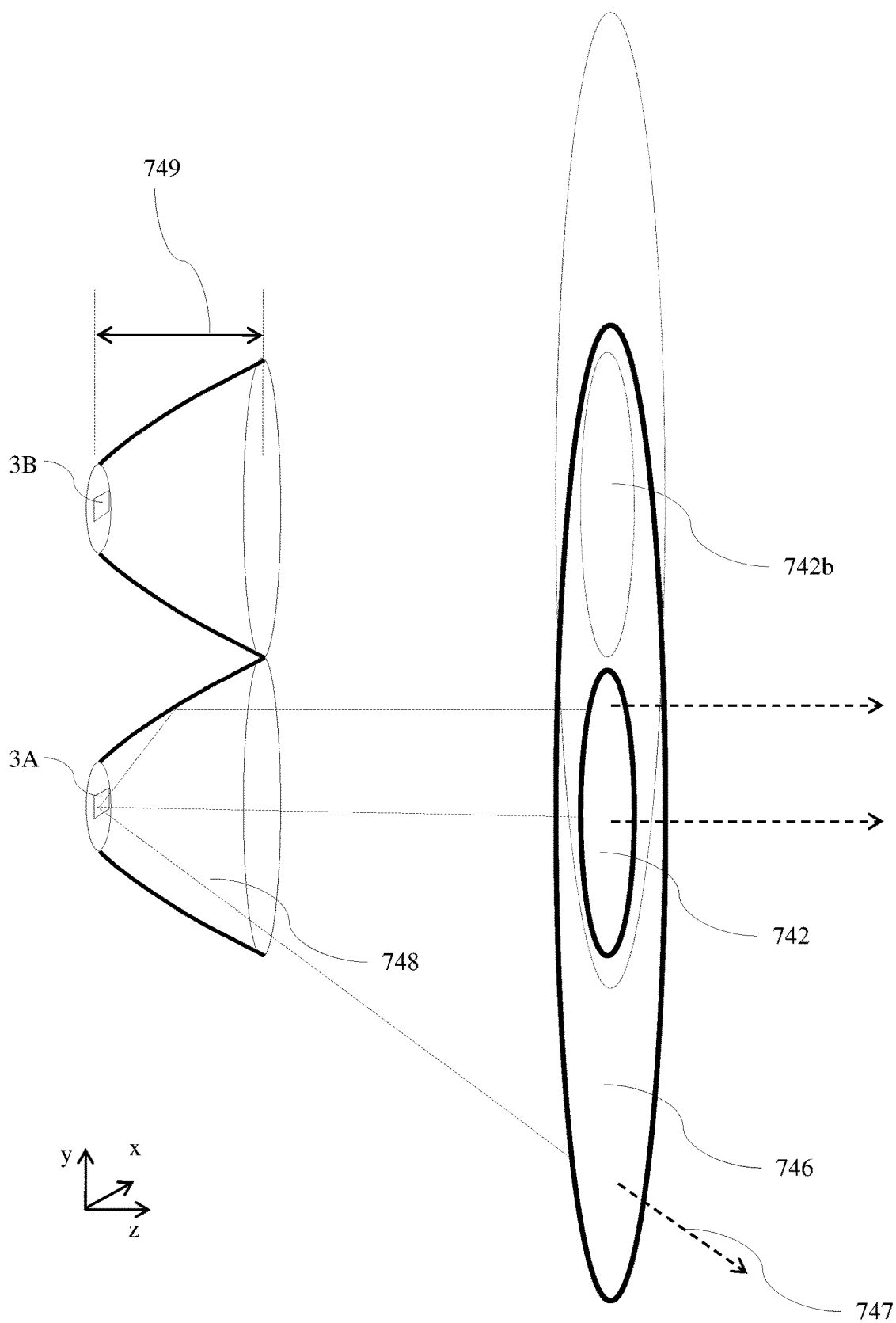
FIG. 12F is a schematic diagram illustrating in perspective view, illumination by a reflective optical element providing an outer halo and a central spot beam.

FIG. 12F is a schematic diagram illustrating in perspective view illumination by a plurality of reflective optical elements providing an outer halo 746 and a central spot beam 742. In comparison to the arrangement of FIG. 12E, the additional spot beam 743 may not be present, however undesirably the halo 746 distributes light over a wider area and degrades background illuminance level, degrading image contrast. The size of the halo 746 may be reduced by increasing the length 749 of the reflective optic. By way of comparison with the present embodiments, this increases device thickness and weight, while not providing high levels of optical isolation between adjacent illumination regions 320.

Figure 12G:
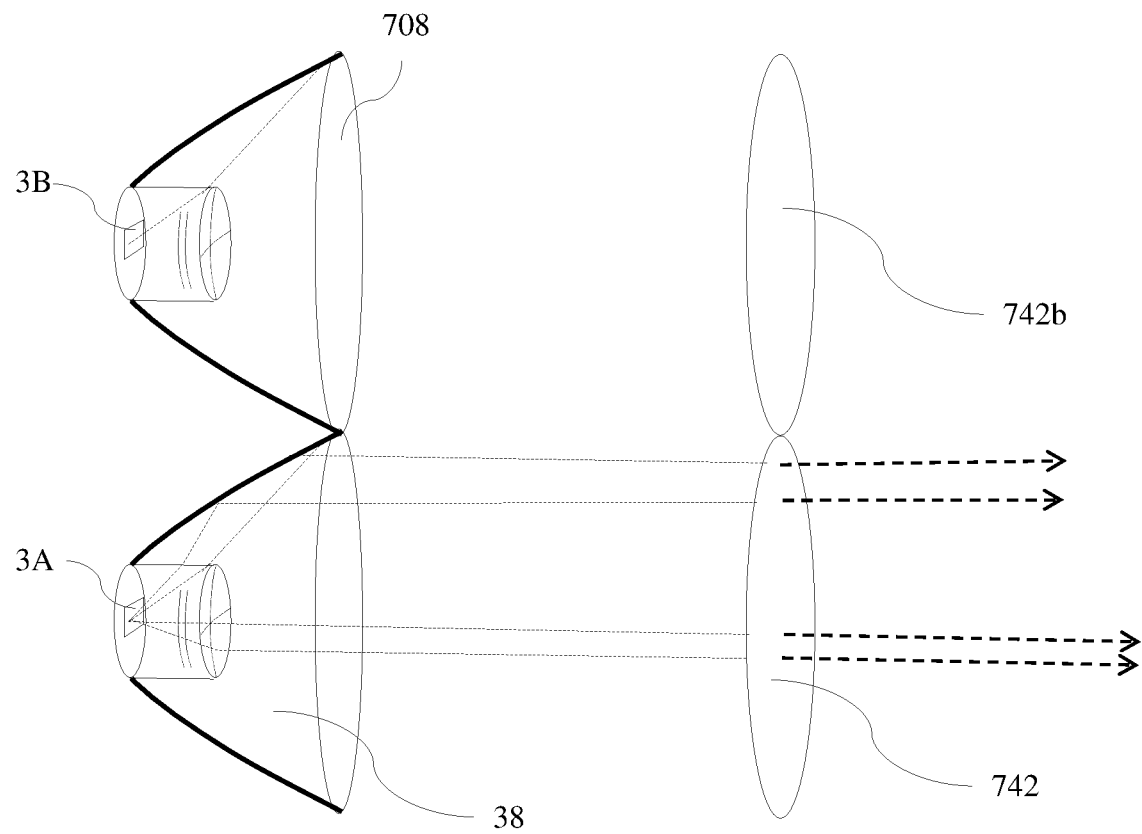
FIG. 12G is a schematic diagram illustrating in perspective view, illumination by a catadioptric optical element providing a central spot beam.

FIG. 12G is a schematic diagram illustrating in perspective view illumination by a plurality of catadioptric optical elements providing a central spot beam. In comparison to the arrangements of FIGS. 12E-12F, neither the background glow 744 or halo 746 are present. Advantageously, in cooperation with lenses 310, shown in FIG. 1, low stray light can be provided in a thin package with high levels of optical isolation in illumination regions 320, achieving low cross talk and high dynamic range in the image.

Further substantially all of the light from micro-LED 3 may be collected by catadioptric optical element 38 such that high efficiency can be achieved.

A method to form an illumination apparatus will now be further described. The illustrative embodiment described above provides more than 90 million individually (matrix) addressable 10 micron sized micro-LEDs to be aligned with catadioptric optical elements 38 with a pitch of approximately 150 microns. Such a display cannot be provided and aligned to catadioptric optical elements by conventional pick and place LED extraction methods. A method and apparatus to provide such arrays is further disclosed in WO2012052723 and incorporated herein in its entirety by reference.

FIGS. 13A-13D are schematic diagrams illustrating in perspective views a method to form an illumination apparatus comprising an array of micro-LEDs 3 and an array of catadioptric optical elements 38.

Figure 13A:
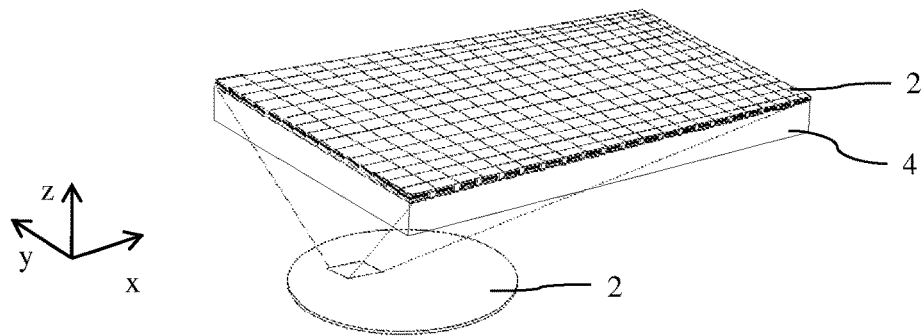
FIGS. 13A-13D are schematic diagrams illustrating in perspective views a method to form an illumination apparatus comprising an array of micro-LEDs and an array of catadioptric optical elements.
Figure 13B:
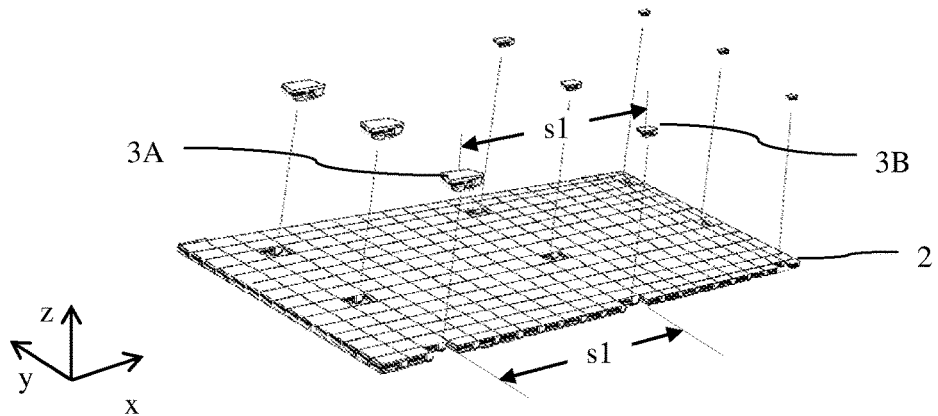
Figure 13C:
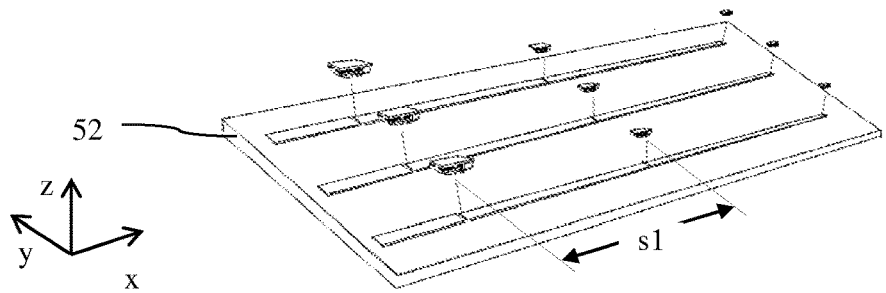
Figure 13D:
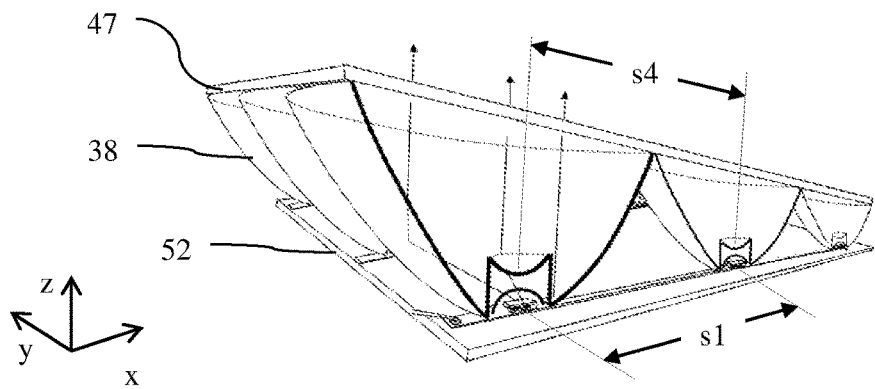

As illustrated in FIG. 13A, the monolithic wafer 2 that may be gallium nitride for example and may be formed on a substrate 4 that may be sapphire for example. The micro-LEDs 3 of the plurality of micro-LEDs are from a monolithic wafer 2 arranged in an array with their original monolithic wafer positions and orientations relative to each other preserved; and wherein in at least one direction, for at least one pair of the plurality of micro-LEDs 3 in the at least one direction, for each respective pair there was at least one respective micro-LED 3 in the monolithic wafer that was positioned in the monolithic wafer 2 between the pair of micro-LEDs in the at least one direction and that is not positioned between them in the array of micro-LEDs 3. Advantageously a high precision array of micro-LEDs may be formed in alignment with a high precision array of catadioptric optical elements 38, so that the array of illumination regions 320 is further formed with high precision and uniformity for alignment with the plurality of apertures 317. As illustrated in FIG. 13B, a non-monolithic array of micro-LEDs 3 may be extracted from the monolithic wafer 2 to provide micro-LEDs 3A, 3B with separation s1. As illustrated in FIG. 13C, micro-LEDs 3A, 3B may be arranged on substrate 52 in alignment with electrodes and other optical elements (not shown). As illustrated in FIG. 13D, the substrate 52 may be aligned with an array of catadioptric optical elements 38 with separations s4 to provide an illumination apparatus, such that separation s4 may be the same as separation s1. Advantageously large numbers of elements may be formed in parallel, over large areas using small numbers of extraction steps, while preserving alignment to a respective array of optical elements. A high precision array of micro-LEDs may be formed in alignment with a high precision array of catadioptric optical elements 38, so that the array of illumination regions 320 is further formed with high precision and uniformity for alignment with the plurality of apertures 317.

Figure 14A:
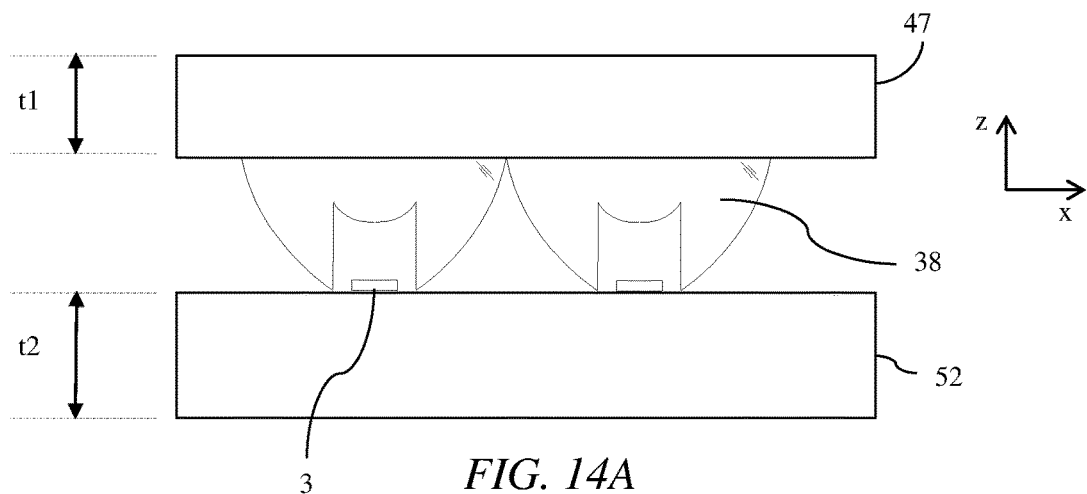
FIGS. 14A-14B are schematic diagrams illustrating in side views thinning of an illumination apparatus.
Figure 14B:
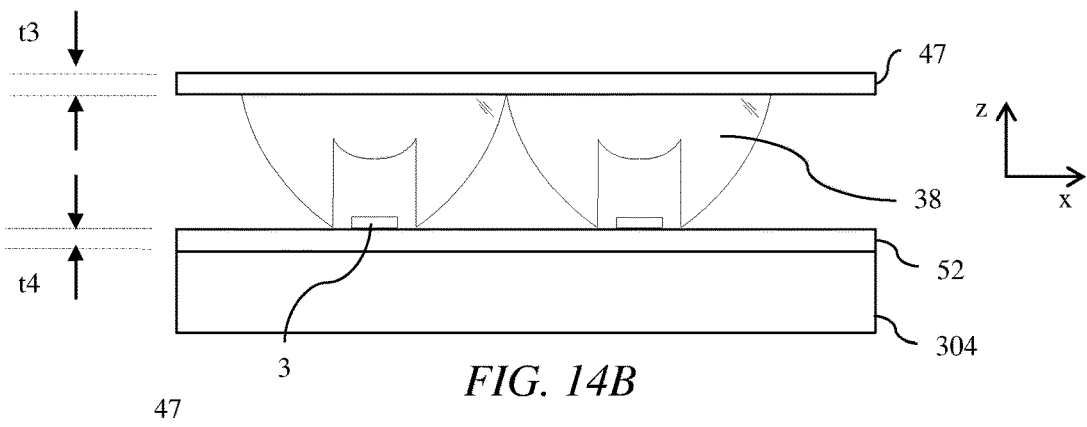

FIGS. 14A-14B are schematic diagrams illustrating in side views, thinning of an illumination apparatus. FIG. 14A illustrates that the thicknesses t1, t2 of substrates 52, 47 may be provided to achieve thermal and mechanical stability in the steps illustrated in FIGS. 13A-13D. In operation, it may be desirable to provide reduced thickness t3, t4, that can be achieved for example by means of chemical-mechanical polishing of the illumination apparatus after alignment step of FIG. 13D. Such a process is further disclosed in WO2012052723 and incorporated herein in its entirety by reference. For example, substrates of thickness 0.4 mm can be provided during manufacture and thinned to less than 0.1 mm to provide low device thickness and flexibility.

Advantageously manufacturing yield can be increased while achieving thin device profile and flexible applications.

Substrate 52 may further be attached to support substrate 304 that may comprise a layer arranged to improve heat extraction from the micro-LEDs 3. In operation the thinner substrate 52 may provide a reduced thermal resistance to the substrate 304 and the junction temperature of the micro-LED 3 may be reduced. Advantageously improved efficiency and increased device lifetime may be achieved.

It would be desirable to provide multiple illumination apparatuses from large areas of aligned optical elements.

Figure 14C:
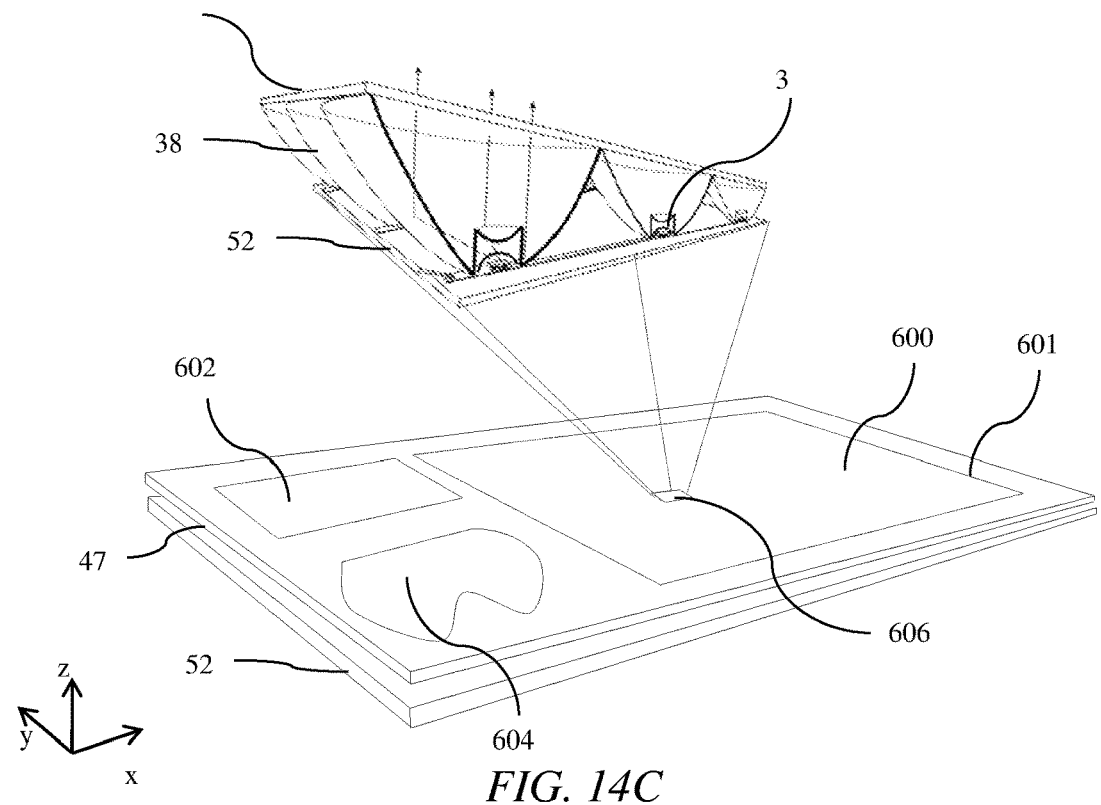
FIG. 14C is a schematic diagram illustrating in perspective view singulation of an illumination apparatus.

FIG. 14C is a schematic diagram illustrating in perspective view singulation of an illumination apparatus. FIG. 14C illustrates that illumination apparatuses with desirable directional distribution characteristics can be extracted, such as by singulation from large area substrates 52, 47, for example to provide different size elements 600, 602 or different shape elements 604. Further device seal lines 601 may be provided at the edge of each element to provide hermetic sealing of the optical elements, and reduce dust and other material ingress into the optical elements during use. Advantageously manufacturing cost and complexity can be reduced, and reliability during use increased. Advantageously multiple devices with different size or shape may be made at one time with the mother substrates having common handling procedures and equipment.

The words "substantially" and "approximately", as may be used in this disclosure provide a tolerance which is accepted in the industry for its corresponding word and/or relativity between items. Such an industry-accepted tolerance ranges from zero to ten percent and corresponds to, but is not limited to, lengths, positions, angles, etc. Such relativity between items ranges between approximately zero to ten percent.

Embodiments of the present disclosure may be used in a variety of optical systems. The embodiment may include or work with a variety of lighting, backlighting, optical components, displays, tablets and smart phones for example. Aspects of the present disclosure may be used with practically any apparatus related to displays, environmental lighting, optical devices, optical systems, or any apparatus that may contain any type of optical system. Accordingly, embodiments of the present disclosure may be employed in displays, environmental lighting, optical systems and/or devices used in a number of consumer professional or industrial environments.

It should be understood that the disclosure is not limited in its application or creation to the details of particular arrangements illustrated, because the disclosure is capable of other embodiments. Moreover, aspects of the disclosure may be set forth in different combinations and arrangements to define embodiments unique in their own right. Also, the terminology used in this disclosure is for the purpose of description and not of limitation.

While embodiments in accordance with the principles that are disclosed herein have been described, it should be understood that they have been presented by way of example only, and not limitation. Therefore, the breadth and scope of this disclosure should not be limited by any of the exemplary embodiments described, but should be defined only in accordance with any claims and their equivalents issuing from this disclosure. In addition, the above advantages and features are provided in described embodiments, but shall not limit the application of such issued claims to processes and structures accomplishing any or all of the above advantages.

The section headings herein are included to provide organizational cues. These headings shall not limit or characterise the embodiments set out in any claims that may issue from this disclosure. To take a specific example, although the headings refer to a "Technical Field," the claims should not be limited by the language chosen under this heading to describe the field. Further, a description of technology in the "Background" is not to be construed as an admission that certain technology is prior art to any embodiment in this disclosure. Neither is the "Summary" to be considered as a characterization of the embodiments in issued claims. Furthermore, any reference in this disclosure to "invention" in the singular should not be used to argue that there is merely one point of novelty in this disclosure. Multiple embodiments may be set forth according to the limitations of the multiple claims issuing from this disclosure, and such claims define the embodiments, and their equivalents, that are protected by them. In all instances, the scope of claims shall be considered on their own merits in the light of this disclosure and should not be constrained by the headings used in this disclosure.

The invention claimed is:

1. A display apparatus, comprising:
    at least one image pixel array relay structure comprising:
        a plurality of micro-LEDs arranged to output light, the plurality of micro-LEDs being arranged in a micro-LED array; and a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements;
    and a low reflection screen comprising a light absorbing structure arranged on a side of a transparent support substrate wherein the light absorbing structure comprises a plurality of light transmitting apertures arranged in an aperture array, the transparent support substrate being arranged between the image pixel array relay structure and the light absorbing structure;
    wherein the at least one image pixel array relay structure and the low reflection screen are aligned such that the light from each of the micro-LEDs and its respective aligned catadioptric optical element is converged towards and relayed to at least one of the light transmitting apertures by the at least one image pixel array relay structure.

2. A display apparatus according to claim 1 further comprising a control system arranged to provide the plurality of micro-LEDs with image data.

3. A display apparatus according to claim 1 further comprising at least one alignment structure arranged to align the plurality of catadioptric optical elements with the plurality of light transmitting apertures.

4. A display apparatus according to claim 3 wherein the alignment structure further comprises a structure support member arranged to provide mechanical fixing between the image pixel array relay structure and the low reflection screen.

5. A display apparatus according to claim 1 wherein the plurality of micro-LEDs is arranged on a backplane substrate and the plurality of catadioptric optical elements is arranged on an optical substrate.

6. A display apparatus according to claim 5 comprising at least two image pixel array relay structures wherein the image pixel array relay structures are tiled and the low reflection screen is aligned to the at least two image pixel array relay structures.

7. A display apparatus according to claim 1 further comprising a diffuser arranged between the light transmitting aperture regions and the transparent support substrate.

8. A display apparatus according to claim 1 wherein a plurality of lenses is arranged between the catadioptric optical element array and the transparent support substrate.

9. A display apparatus according to claim 8, wherein the plurality of micro-LEDs is arranged on a backplane substrate and the plurality of catadioptric optical elements is arranged on an optical substrate, and wherein the plurality of lenses is arranged on at least one of the optical substrate and the transparent support substrate.

10. A display apparatus according to claim 8 wherein each of the plurality of lenses is arranged to receive light from at least two micro-LEDs of the plurality of micro-LEDs.

11. A display apparatus according to claim 1 wherein the average reflectance to white light of the light absorbing structure is less than 4%, preferably less than 2% and most preferably less than 1%.

12. A display apparatus according to claim 1 wherein the light absorbing structure comprises a microstructured surface.

13. A display apparatus according to claim 12 wherein the microstructured surface comprises a corner cube retro-absorber structure.

14. A display apparatus according to claim 12 wherein the microstructured surface comprises a comb structure.

15. A display apparatus according to claim 1 wherein the low reflection screen is further provided with acoustic apertures.

16. A display apparatus according to claim 15 wherein the acoustic apertures comprise an array of holes to transmit sound.

17. A display apparatus according to claim 16 wherein the array of holes has a profile arranged to reduce light transmission from the image pixel array relay structure.

18. A display apparatus according to claim 1 wherein acoustic transducers are provided on the at least one image pixel array relay structure.

19. A display apparatus according to claim 18 wherein the plurality of micro-LEDs provides blue light and at least one wavelength conversion layer is arranged to convert blue light into yellow or green or red light.

20. A display apparatus according to claim 1 wherein a wavelength conversion layer and/or colour filter is arranged between at least one light transmitting aperture region and the transparent support substrate.

21. A display apparatus according to claim 20 wherein the plurality of micro-LEDs provide white light and red, green and blue colour filters are provided respectively in different light transmitting aperture regions.

22. A display apparatus according to claim 1 wherein a width or diameter of the micro-LEDs is less than 300 microns, preferably less than 200 microns and more preferably less than 100 microns.

23. A display apparatus according to claim 1 wherein in the at least one catadioptric cross-sectional plane some of the light output of micro-LEDs of the plurality of micro-LEDs is transmitted by the at least one transparent inner surface before it is reflected at the first or second outer surfaces and directed into a first directional light output distribution; and
some of the light output of the micro-LEDs of the plurality of micro-LEDs is transmitted by the at least one transparent inner surface and directed into the first directional light output distribution without reflection at the first or second outer surfaces.

24. A display apparatus according to claim 1 wherein the plurality of micro-LEDs comprises inorganic micro-LEDs.

25. A display apparatus according to claim 1 wherein
the micro-LEDs of the plurality of micro-LEDs are from a monolithic wafer arranged in an array with their original monolithic wafer positions and orientations relative to each other preserved; and
wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs.

26. A display apparatus according to claim 1 wherein the second end of at least one catadioptric optical element of the plurality of catadioptric optical elements is arranged on the first side of an optical element support substrate.

27. A display apparatus according to claim 1 wherein the catadioptric optical elements of the plurality of catadioptric optical elements comprise a material transparent to at least one operating wavelength of at least one element of the plurality of micro-LEDs.

28. A composite display apparatus comprising at least two display apparatuses of claim 1 provided in a tiled arrangement.

29. A display apparatus according to claim 1, wherein each of the catadioptric optical elements of the plurality of catadioptric optical elements comprises, in at least one cross-sectional plane through its optical axis:
a first outer surface and a second outer surface facing the first outer surface;
wherein the first and second outer surfaces extend from a first end of the catadioptric optical element to a second end of the catadioptric optical element, the second end of the catadioptric optical element facing the first end of the catadioptric optical element;
wherein the distance between the first and second outer surfaces at the first end of the catadioptric optical element is less than the distance between the first and second outer surfaces at the second end of the catadioptric optical element; and
at least one transparent inner surface arranged between the first and second ends and between the first and second outer surfaces.

30. A display apparatus according to claim 29 wherein the alignment in correspondence between a catadioptric optical element of the plurality of catadioptric optical elements and its respective one or more of the micro-LEDs of the plurality of micro-LEDs comprising the respective one or more of the micro-LEDs of the plurality of micro-LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element.

31. A display apparatus according to claim 29 wherein in the at least one catadioptric cross-sectional plane the distance between the first and second outer surfaces at the second end of the catadioptric optical element is less than 3 mm, preferably less than 1.5 mm and more preferably less than 0.75 mm.

32. A display apparatus according to claim 29 wherein the cross-section from one side to another side of the micro-LED is aligned within the first end of the catadioptric optical element.

33. A display apparatus according to claim 29 wherein in the at least one catadioptric cross-sectional plane, an exterior angle between the first end and the first and second outer surfaces at the first end is less than an exterior angle between the first end and the first and second outer surface at the second end.

34. A display apparatus according to claim 29 wherein in the at least one catadioptric cross-sectional plane at least one of the transparent inner surfaces has positive optical power.

35. A display apparatus according to claim 29 wherein in the at least one catadioptric cross-sectional plane at least one of the transparent inner surfaces has zero optical power.

36. A display apparatus according to claim 29 wherein the cross-section from one side to another side of the micro-LED is aligned within the first end of the catadioptric optical element.

37. A display apparatus according to claim 29 wherein a refractive optical element is provided between the micro-LEDs of the plurality of micro-LEDs and the at least one transparent inner surface.

38. A display apparatus according to claim 37 wherein the refractive optical element is a hemispherical lens.

39. A display apparatus according to claim 1 wherein the plurality of micro-LEDs further comprises a wavelength converting layer.

40. A display apparatus according to claim 39 wherein the wavelength converting layer comprises a phosphor material or a quantum dot material.

* * * * *